(12) United States Patent
Miyai

(10) Patent No.: US 6,184,080 B1
(45) Date of Patent: Feb. 6, 2001

(54) METHOD OF THE SIMULTANEOUS FORMATION FOR THE STORAGE NODE CONTACTS, BIT LINE CONTACTS, AND THE CONTACTS FOR PERIPHERY CIRCUITS

(75) Inventor: Yoichi Miyai, Kodaira (JP)

(73) Assignee: Texas Instruments Incorporated, Dallas, TX (US)

( * ) Notice: Under 35 U.S.C. 154(b), the term of this patent shall be extended for 0 days.

(21) Appl. No.: 09/390,566

(22) Filed: Sep. 3, 1999

Related U.S. Application Data
(60) Provisional application No. 60/099,269, filed on Sep. 4, 1998.

(51) Int. Cl.[7] .................................................. H01L 21/8242
(52) U.S. Cl. ............................................ 438/253; 438/399
(58) Field of Search .................................. 438/253, 254, 438/255, 256, 396, 397, 398, 399, 3

(56) References Cited

U.S. PATENT DOCUMENTS

| | | | | |
|---|---|---|---|---|
| 6,124,199 | * | 9/2000 | Gambino et al. | 438/622 |
| 6,127,260 | * | 10/2000 | Huang | 438/629 |

OTHER PUBLICATIONS

Y. Kohyama et al., "A Fully Printable, Self–aligned and Planarized Stacked Capacitor DRAM Cell Technology for 1 Gbit DRAM and Beyond," 1997 *Symposium on VLSI Technology Digest of Technical Papers* 17–18.

* cited by examiner

Primary Examiner—Tuan H. Nguyen
(74) Attorney, Agent, or Firm—Peter K. McLarty; W. James Brady, III; Frederick J. Telecky, Jr.

(57) ABSTRACT

A dynamic random access memory device comprises a substrate, a plurality of active regions, a plurality of substantially parallel word lines, a plurality of substantially parallel bit lines, a plurality of unitary bit line contacts, a plurality of storage nodes, and a plurality of unitary storage node contacts. The unitary bit line contacts and the unitary storage node contacts can be formed simultaneously and can interconnect the bit lines and the active regions, and the storage nodes and the active regions respectively. The bit line contacts can also be used for the contacts for the periphery circuitry, and the depth between the periphery circuit contacts to the substrate is sufficiently shallow such that good ohmic contacts can be formed in the periphery circuit. Further, a special pattern mask is employed to form the bit line contacts and the storage node contacts simultaneously, in order to reduce manufacturing costs. The special pattern can be longer than the active regions to prevent short circuits due to photolithography misalignment errors.

7 Claims, 36 Drawing Sheets

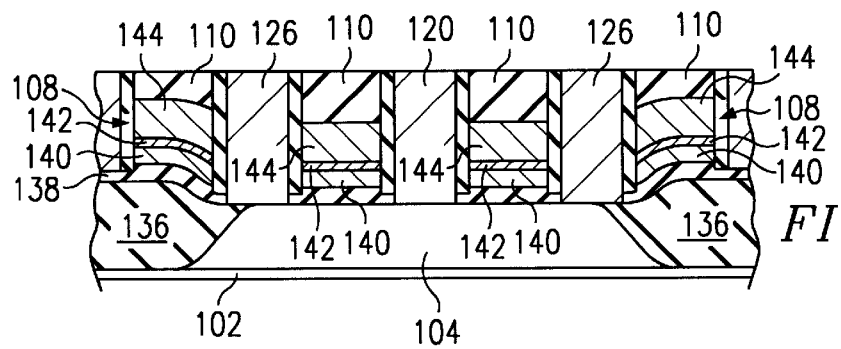
FIG. 14A
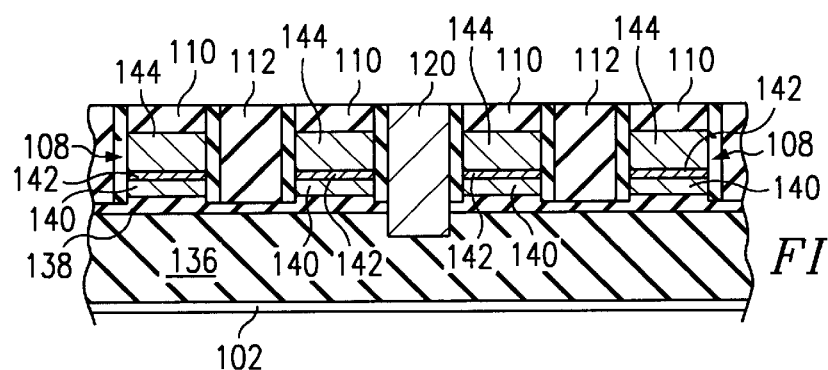
FIG. 14B
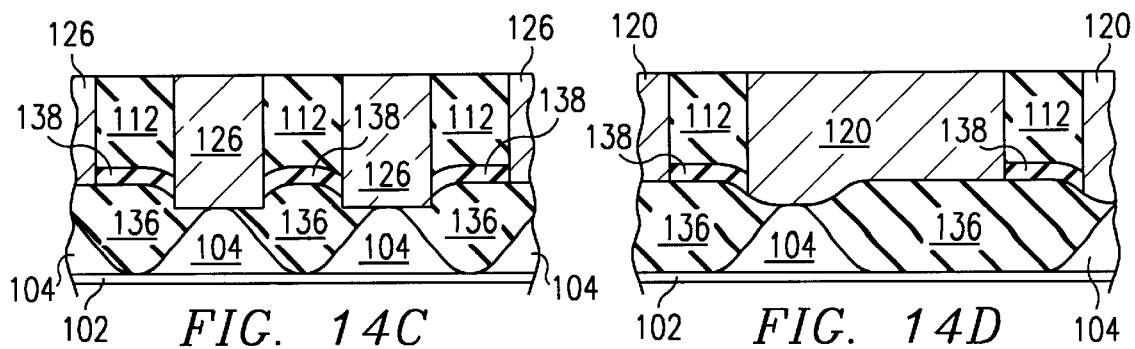
FIG. 14C
FIG. 14D

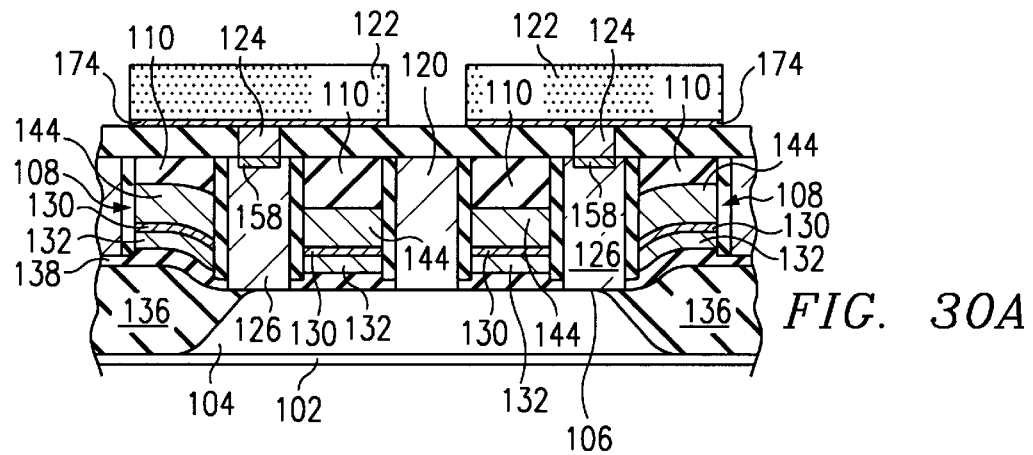
FIG. 30A
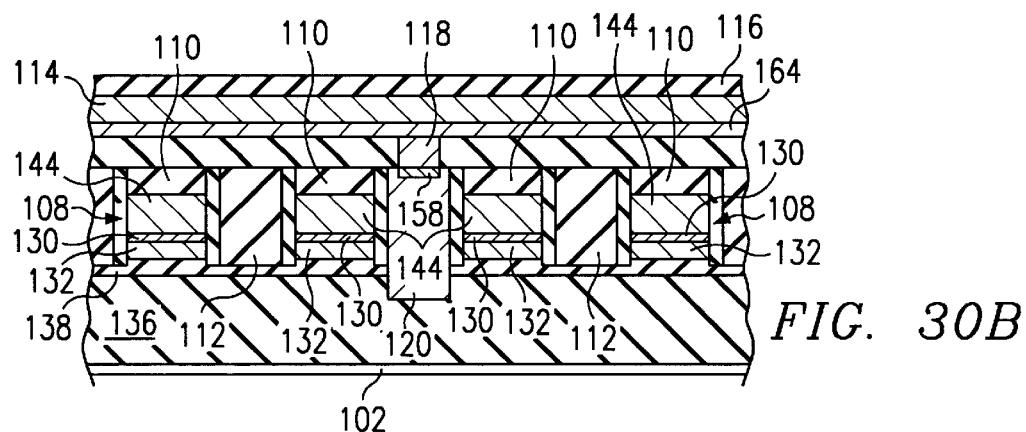
FIG. 30B
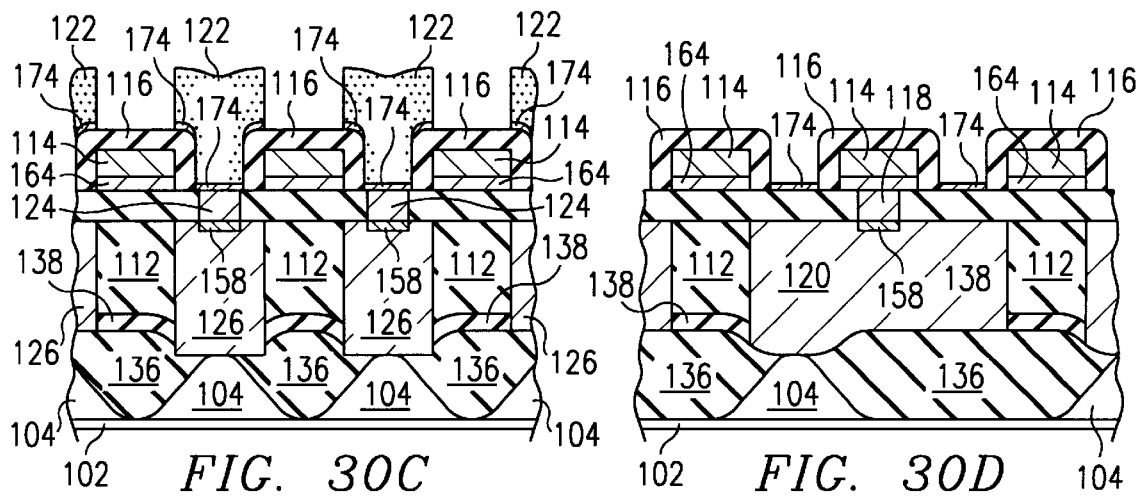
FIG. 30C
FIG. 30D

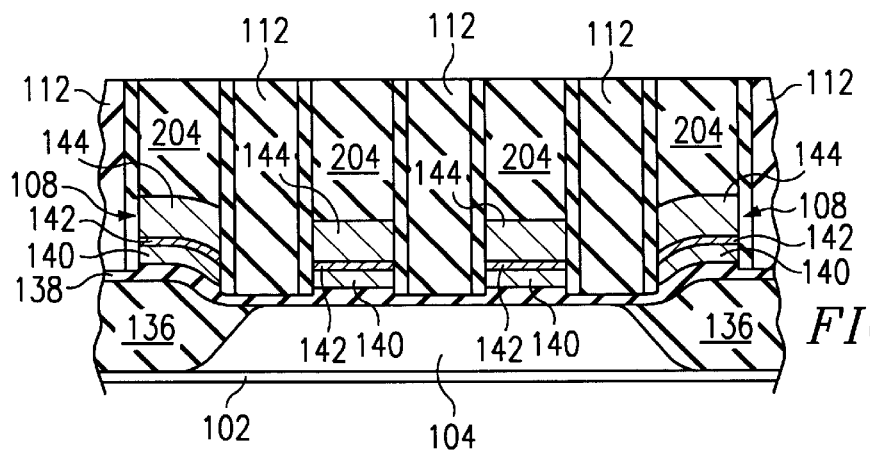
FIG. 42A
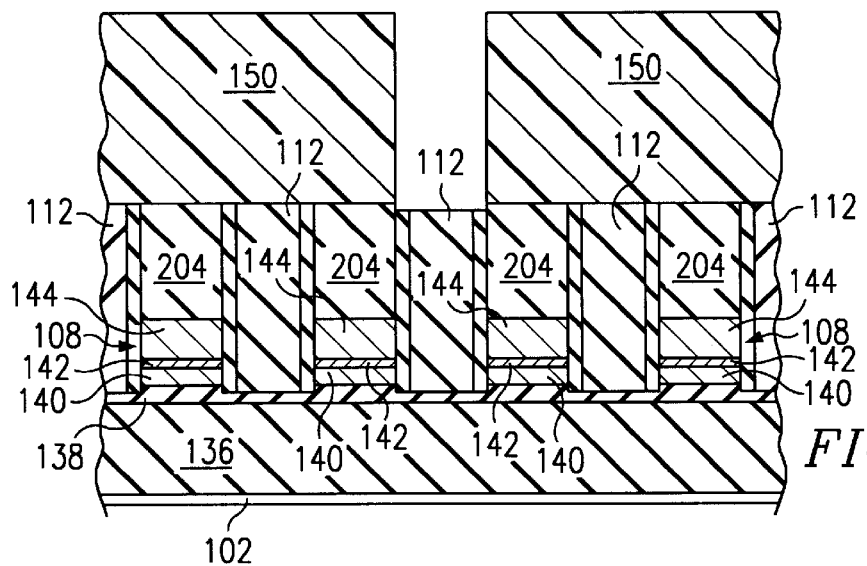
FIG. 42B
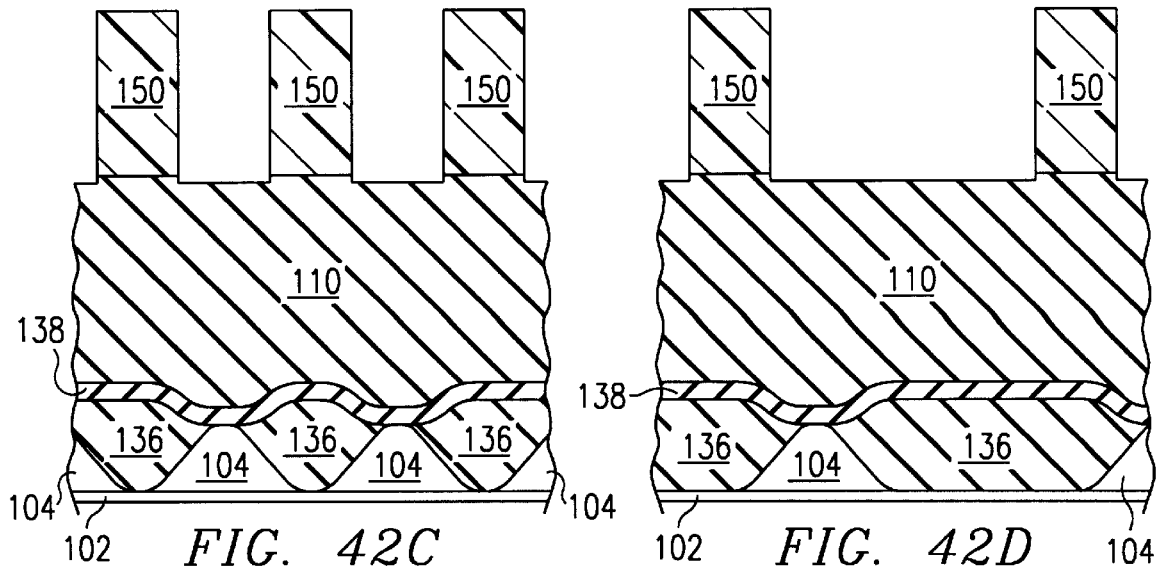
FIG. 42C
FIG. 42D

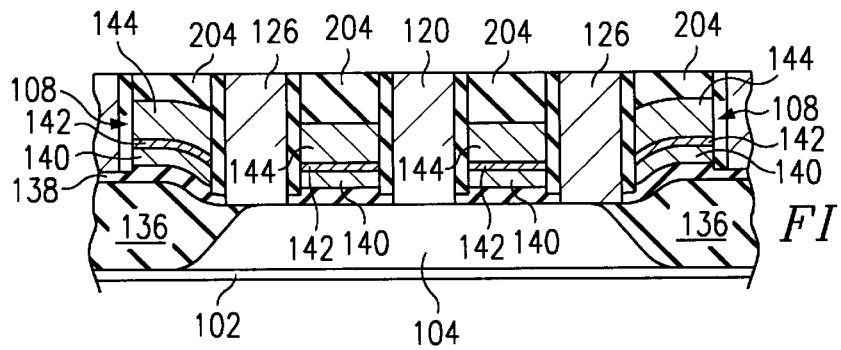
*FIG. 44A*
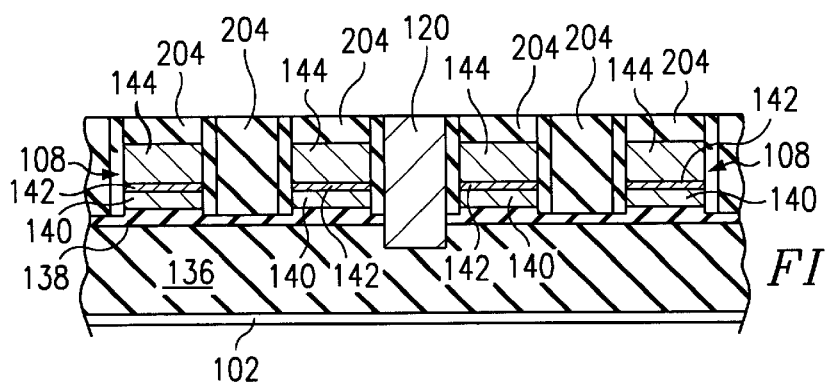
*FIG. 44B*
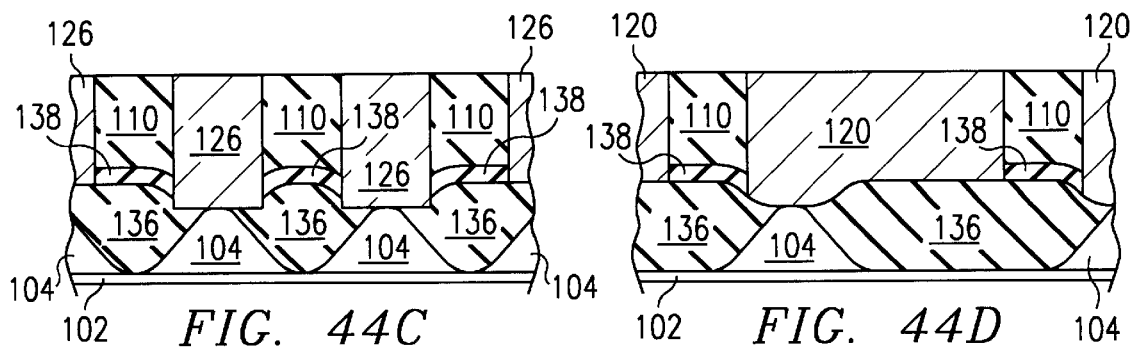
*FIG. 44C*     *FIG. 44D*

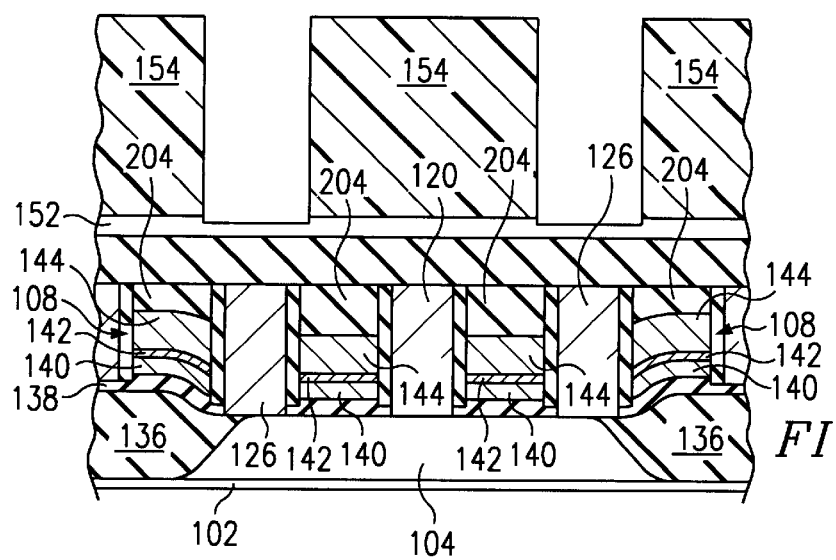
FIG. 47A
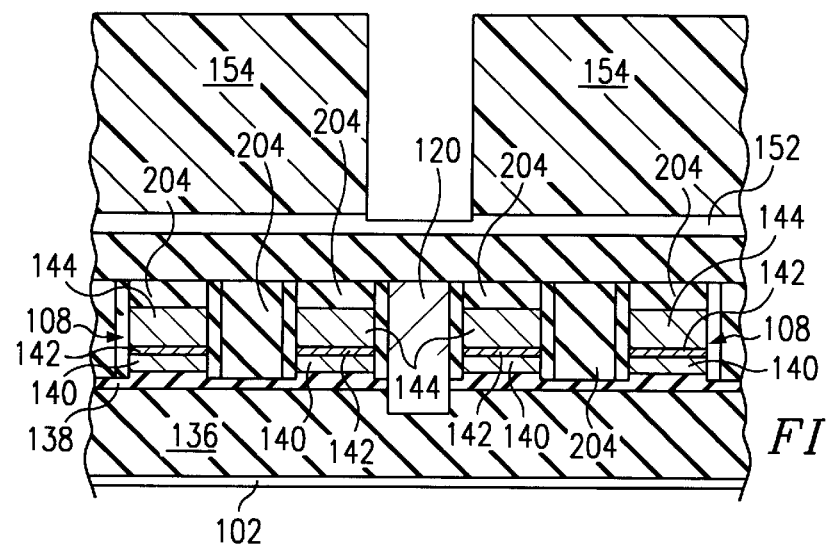
FIG. 47B
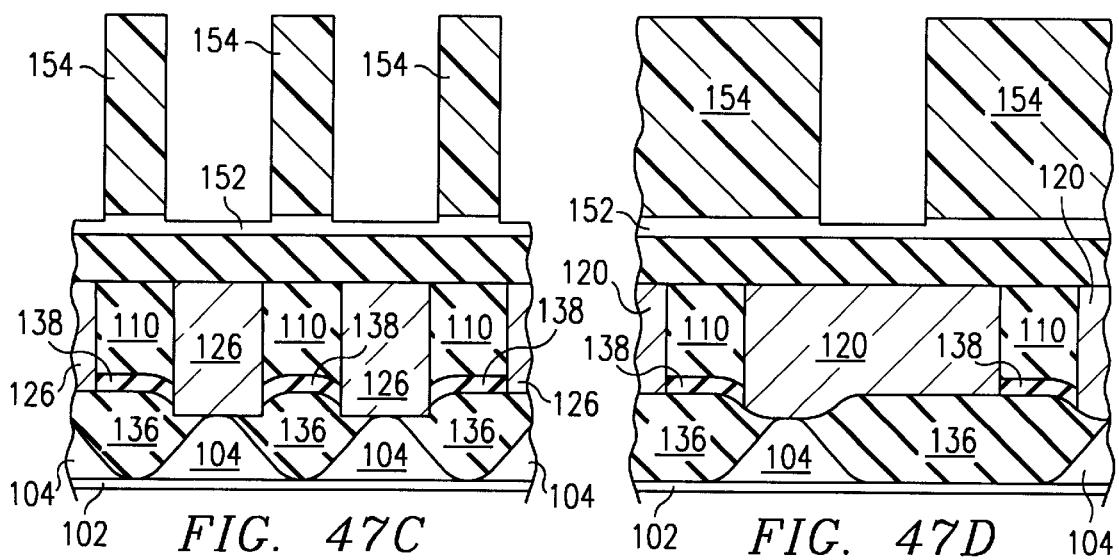
FIG. 47C
FIG. 47D

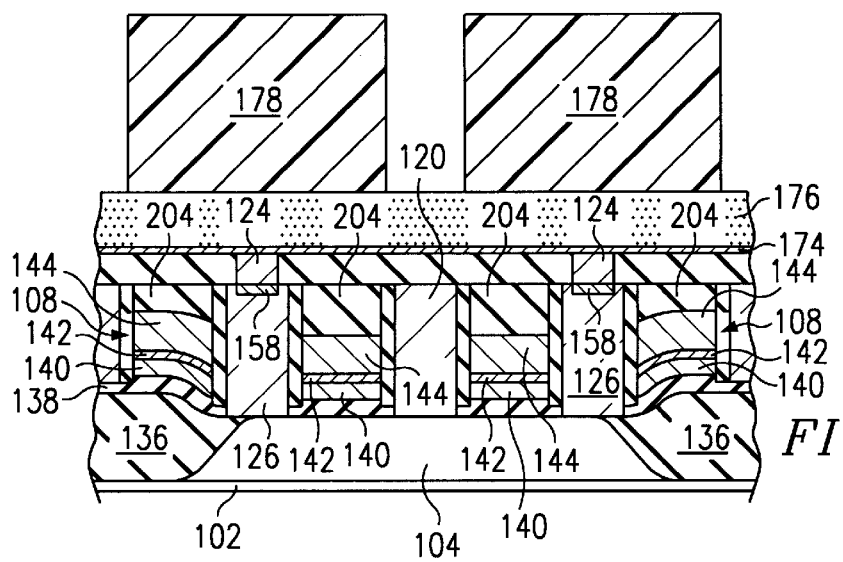
FIG. 59A
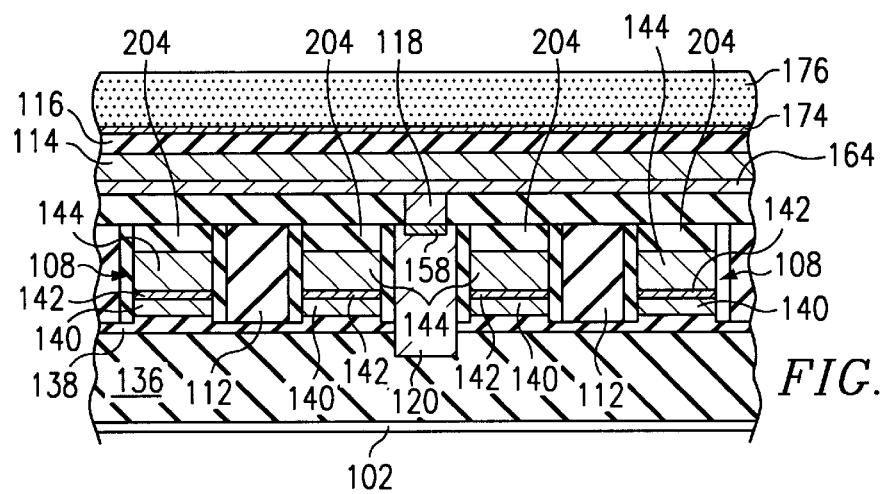
FIG. 59B
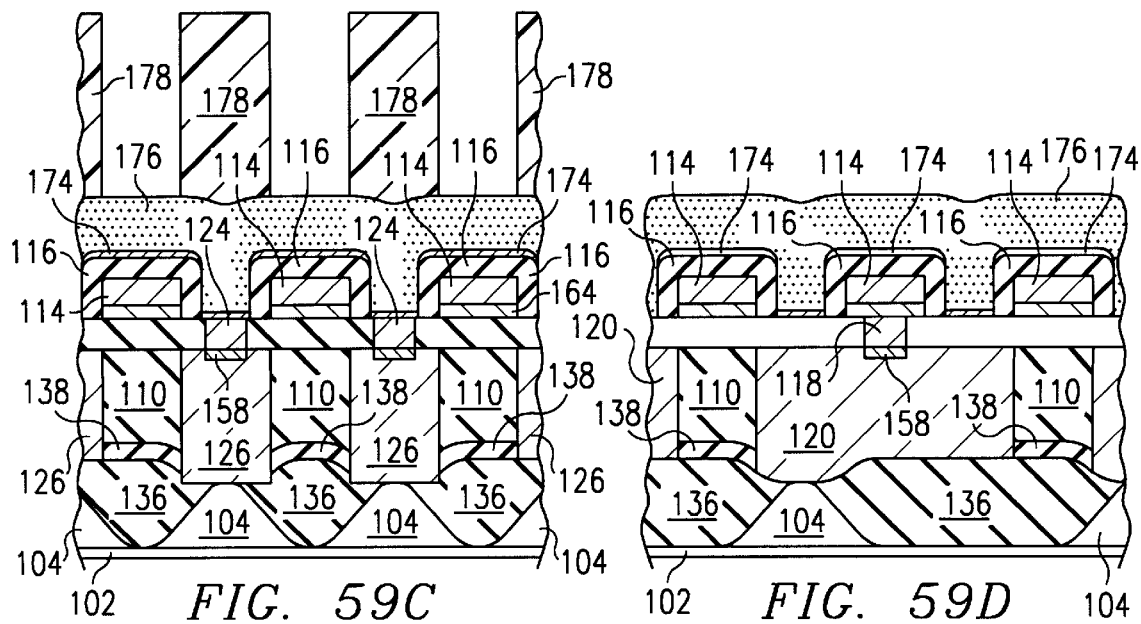
FIG. 59C
FIG. 59D

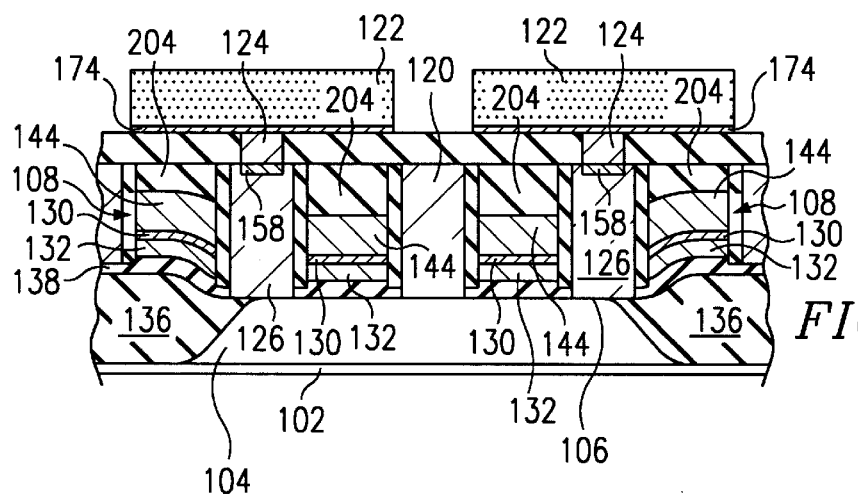
FIG. 60A
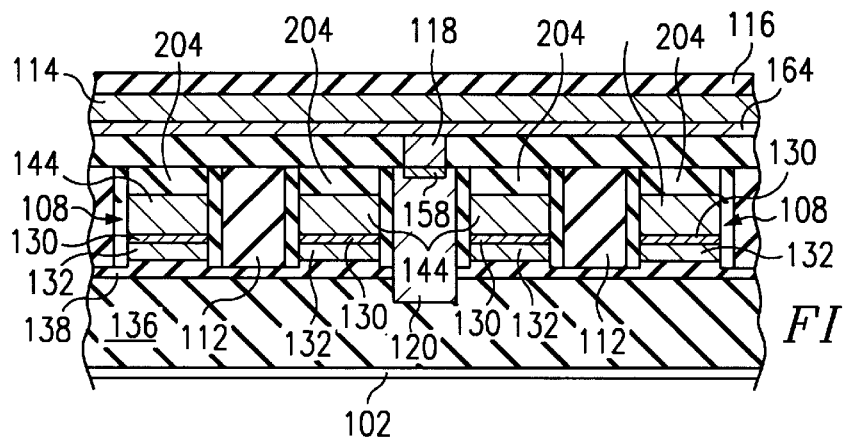
FIG. 60B
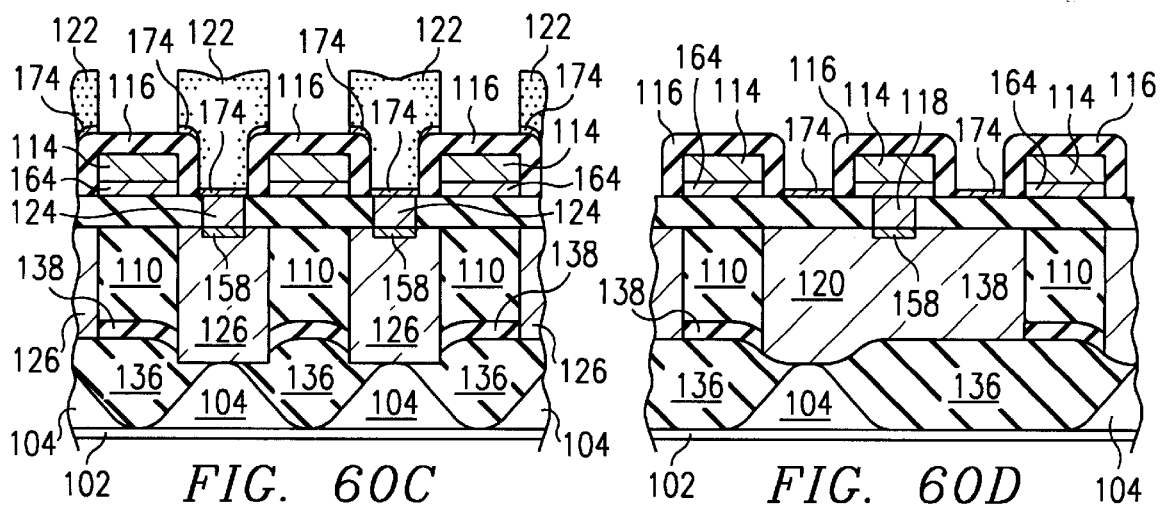
FIG. 60C
FIG. 60D

METHOD OF THE SIMULTANEOUS FORMATION FOR THE STORAGE NODE CONTACTS, BIT LINE CONTACTS, AND THE CONTACTS FOR PERIPHERY CIRCUITS

This application claims priority under 35 USC §119(e)(1) of provisional application number 60/099,269 filed Sep. 4, 1998.

TECHNICAL FIELD OF THE INVENTION

This invention relates generally to dynamic random access memory (DRAM) devices and particularly relates to a DRAM apparatus wherein the contacts for the storage nodes, the bit lines and the periphery circuits can all be formed simultaneously, and to a method for forming such a device.

BACKGROUND OF THE INVENTION

Continued growth in the capacity of dynamic random access memory (DRAM) technology can be enhanced by minimizing the size of individual DRAM cells. As technology develops, DRAM devices need to store more bits of information, use less power per bit of stored information and have the individual memory cells containing the stored bits occupy less area on the semiconductor chip. Furthermore, it is desirable to simplify the manufacturing process for DRAM devices, and thereby lower the cost of such devices. Each cell in such a device typically comprises a MOS pass transistor and a storage node forming one plate of a storage capacitor.

In order to simplify the manufacturing process and minimize the cell size of DRAM cells, there are three requirements which should be simultaneously satisfied. These include the simultaneous formation of the storage node contacts, the bit line contacts, and the contacts in the periphery circuit; the formation of the bit lines in a straight line configuration; and the use of the bit lines as wiring for the periphery circuits.

It has proven difficult to meet the requirement of simultaneous formation of the storage node, bit line and periphery circuit contacts by simple simultaneous formation of these contacts. An inward portion of the storage node contact is normally formed of either n-type or p-type doped polysilicon. This is due to the fact that employing metal in these locations is generally not desirable, since it would reduce the data retention time on the storage node, which would in turn require more frequent refreshing for the DRAM. Conversely to the situation for the storage node contacts, the contacts for the periphery circuit generally do require metal at inward portions, in order to form ohmic contacts for both n-type and p-type active regions. Doped polysilicon normally cannot be employed in this application.

Reference should now be had to FIGS. 1, 2 and 3. FIG. 1 shows a top plan view of a prior art DRAM device, while FIG. 2 shows a cross section taken along line II—II in FIG. 1 and FIG. 3 shows a cross section taken along line III—III in FIG. 1. The prior art device is designated generally as 10. It includes a plurality of word lines 12 and a plurality of bit lines 14. Also included are a plurality of storage nodes 16 and a plurality of active regions 18. A first type of contact is designated as 20 and a second type of contact is designated as 22. With particular reference to FIGS. 2 and 3, storage node 16 is interconnected to active region 18 through the second type of contact 22, an intermediate polysilicon pad 24, and the first type of contact 20. Similarly, bit line 14 is interconnected to active region 18 through the second type of contact 22, intermediate polysilicon pad 24, and the first type of contact 20. Isolators 26 are also shown in FIGS. 2 and 3. Note that a cell over bit line (COB) type of device is shown in the figures.

The prior art device shown in FIGS. 1–3 is subject to several problems. First, extra manufacturing steps are required. For example, an additional photolithography process is required for the formation of the first type of contact 20 and the pad 24. Additional deposition and etching processes are also required in conjunction with the photolithography process. Thus, manufacturing cost is increased. Further, the height of the second type of contact 22 from the substrate on which the active region 18 is formed to the bit lines 14 (which are also used as wiring in the periphery circuits) is increased due to the additional thickness needed for the first type of contact 20 and the polysilicon pad 24. This has caused difficulty in forming good ohmic contacts, that is, the second type of contact 22, in the periphery circuits.

Another prior device is disclosed in the article by Y. Kohyama et al. entitled "A Fully Printable, Self-aligned and Planarized Stacked Capacitor DRAM Cell Technology for 1 Gbit DRAM and Beyond," 1997 Symposium on VLSI Technology Digest of Technical Papers 17. This device employs polysilicon plugs with a so-called "Gate SAC" mask. The masked regions are identical in size and shape to the active areas. There is no provision for having a reduced contact diameter so as to prevent misalignment between the contacts (for the storage nodes, e.g.) and the polysilicon plugs, nor is there provision to prevent shorting together of some of the plugs due to alignment errors during photolithography.

SUMMARY OF THE INVENTION

Therefore, a need has arisen for a DRAM device which is designed such that the storage node contacts, bit line contacts, and the contacts for the periphery circuits can be formed simultaneously. Further, there is a need for a method of forming such a device. The present invention provides such a device, which results in simplified manufacturing and less distance between the substrate and periphery circuit wiring, and which is tolerant of misalignment errors during manufacturing.

In accordance with the present invention, a dynamic random access memory device comprises a substrate formed of a semiconductor material; a plurality of substantially parallel word lines; a plurality of substantially parallel bit lines; a plurality of unitary bit line contacts; a plurality of storage nodes; and a plurality of unitary storage node contacts. The plurality of active regions extend outwardly from the substrate, which is formed of semiconductor material, and each active region has an outer surface and a longer and a shorter dimension when viewed in plan. The plurality of substantially parallel word lines are located outwardly from the active regions in a direction substantially parallel to the shorter dimension of the active regions and substantially perpendicular to the longer dimension of the active regions. The word lines are electrically isolated from each other, and two of the word lines are associated with each of the active regions. Further, two of the word lines are positioned between adjacent active regions.

The plurality of substantially parallel bit lines are located outwardly from the word lines and are substantially perpendicular to the word lines. The bit lines are located between adjacent ones of the active regions when viewed in plan, and are electrically isolated from each other. Each of the bit lines has an inward-projecting portion (or contact) associated with each of the active regions. The plurality of unitary bit line contacts (or contact plugs) extends from the inward-projecting portions of the bit lines to associated ones of the active regions and is offset when viewed in plan view and also when viewed in cross-section perpendicular to the bit lines. This feature aids in the simultaneous formation of the bit line contacts.

The plurality of storage nodes extend outwardly of the bit lines, and each of the storage nodes has a longer and a shorter dimension when viewed in plan. The longer dimension of the storage nodes is generally parallel to the longer dimension of the active regions and the shorter dimension of the storage nodes is generally parallel to the shorter dimension of the active regions. At least substantial portions of the storage nodes are located substantially directly outwardly of the active regions when viewed in plan and are also located between the bit lines when viewed in plan. Each of the storage nodes has an inward-projecting portion (or contact) associated with a given one of the active regions, with two of the storage nodes being associated with each of the active regions.

One of each of the storage node contacts (or contact plugs) extends inwardly from each of the inwardly-projecting portions (or contacts) of the storage nodes to a corresponding one of the active regions with which a given one of the storage nodes is associated.

In accordance with the present invention, a method for manufacturing a dynamic random access memory device comprises the steps of providing a substrate of semiconductor material; forming a plurality of active regions from the semiconductor material; forming a plurality of isolation regions; forming a plurality of substantially parallel word lines; depositing a first word line insulation material; filling spaces between the word lines with a second word line insulation material; and applying a special pattern mask over portions of the second insulation material where periphery circuit wiring is to be formed. Further, the method also includes the steps of selectively etching the second word line insulation material; depositing doped polysilicon to simultaneously form unitary bit line contacts and unitary storage node contacts; simultaneously forming a plurality of inwardly-projecting bit line portions and a plurality of inwardly-projecting storage node portions; forming a plurality of substantially parallel bit lines; and forming a plurality of storage nodes.

The substrate of semiconductor material which is provided can have a main outer surface. In the step of forming the active regions, they can extend outwardly from the main outer surface of the substrate, and each can have an outer surface and a longer and a shorter dimension when viewed in plan, as described above for the apparatus. The isolation regions can be formed of an insulating material, between the active regions.

In the step of forming the word lines, these can be located outwardly from the active regions in a direction which is substantially parallel to the shorter dimension of the active regions and substantially perpendicular to the longer dimension of the active regions, and two of the word lines can be associated with each of the active regions, with two of the word lines positioned between adjacent active regions, all as described above with respect to the apparatus. When depositing the first word line insulation material, it can be deposited so as to surround both the word lines and those portions of the DRAM device where periphery circuit gate wiring is to be formed. The second word line insulation material which is filled into spaces between the word lines can be selectively etchable with respect to the first word line insulation material. The special pattern mask can be applied over portions of the second insulation material where the periphery circuit wiring is to be formed.

The selective etching of the second word line insulation material can be performed so as to create a plurality of doped polysilicon receiving cavities, and doped polysilicon, of which the unitary bit line contacts (or contact plugs) and storage node contacts (or contact plugs) are formed, can be deposited in the doped polysilicon receiving cavities. The unitary bit line contacts can have outer surfaces and can extend inwardly to corresponding ones of the active regions, one each for each of the active regions. Further, the unitary storage node contacts can have outer surfaces and can extend inwardly to corresponding ones of the active regions, two each for each of the active regions.

The plurality of simultaneously-formed inwardly-projecting bit line portions (or contacts) can be formed such that there is one for each of the bit line contacts (or contact plugs), and the plurality of simultaneously-formed inwardly-projecting storage node portions (or contacts) can be formed one for each of the storage node contacts (or contact plugs).

The bit lines are physically identical to the periphery circuit wiring, and the bit line contacts and contacts for the periphery circuits are also identical.

In the step of forming the plurality of bit lines, the bit lines can be located outwardly from the word lines and be substantially perpendicular thereto, and the bit lines can be located between adjacent ones of the active regions when viewed in plan. Further, the bit lines can be electrically isolated from each other and each can be electrically interconnected with corresponding ones of the inwardly-projecting bit line portions.

Finally, in the step of forming the plurality of storage nodes, these can extend outwardly of the bit lines and each of the storage nodes can have a longer and a shorter dimension when viewed in plan. The longer dimension of the storage nodes can be generally parallel to the longer dimension of the active regions and the shorter dimension of the storage nodes can be generally parallel to the shorter dimension of the active regions. At least substantial portions of the storage nodes can be located substantially directly outwardly of the active regions when viewed in plan and can also be located between the bit lines when viewed in plan. The storage nodes can be electrically interconnected with corresponding ones of the inwardly-projecting storage node portions.

Technical advantages of the present invention include a formation process which has a reduced number of photolithography, deposition and etching steps compared to prior art processes, and accordingly, should be more cost effective. Further, the distance between the bit lines and the substrate can be less than in the prior art devices, such that better ohmic contact can be obtained for the periphery circuits. Yet further, manufacturing inaccuracies can be better tolerated.

Other technical advantages of the present invention will be readily apparent to one skilled in the art from the following figures, descriptions, and claims.

BRIEF DESCRIPTION OF THE DRAWINGS

For a more complete understanding of the present invention and the advantages thereof, reference is now to be made to the following description taken in conjunction with the accompanying drawings in which like reference numbers indicate like features and wherein:

FIGS. 5A–11A depict method steps in a method for manufacturing the device of FIG. 4, taken along line A—A in FIG. 4;

FIGS. 12A–12D through 14A–14D depict subsequent method steps in the manufacturing process taken along lines A—A, B—B, C—C and D—D respectively in FIG. 4;

FIGS. 18A–21A depict subsequent manufacturing steps viewed in cross-section along line A—A of FIG. 4;

FIGS. 29A–29D and 30A–30D depict yet further manufacturing steps viewed along lines A—A, B—B, C—C and D—D in FIG. 4;

FIGS. 35A–41A depict method steps in an alternative manufacturing method according to the present invention taken along line A—A of FIG. 4 which is also representative of a top view of a device produced according to the second embodiment of the method;

FIGS. 42A–42D through 44A–44D depict subsequent steps in the second manufacturing process taken along lines A—A, B—B, C—C and D—D respectively of FIG. 4;

FIGS. 47A–47D depict a further step in the second method taken along lines A—A, B—B, C—C and D—D respectively;

FIGS. 48A–51A depict yet further manufacturing steps in the second method taken along line A—A in FIG. 4;

FIGS. 59A–59D and 60A–60D depict yet further steps in the second manufacturing method taken along lines A—A, B—B, C—C and D—D respectively in FIG. 4;

DETAILED DESCRIPTION OF THE INVENTION

Figure 1:
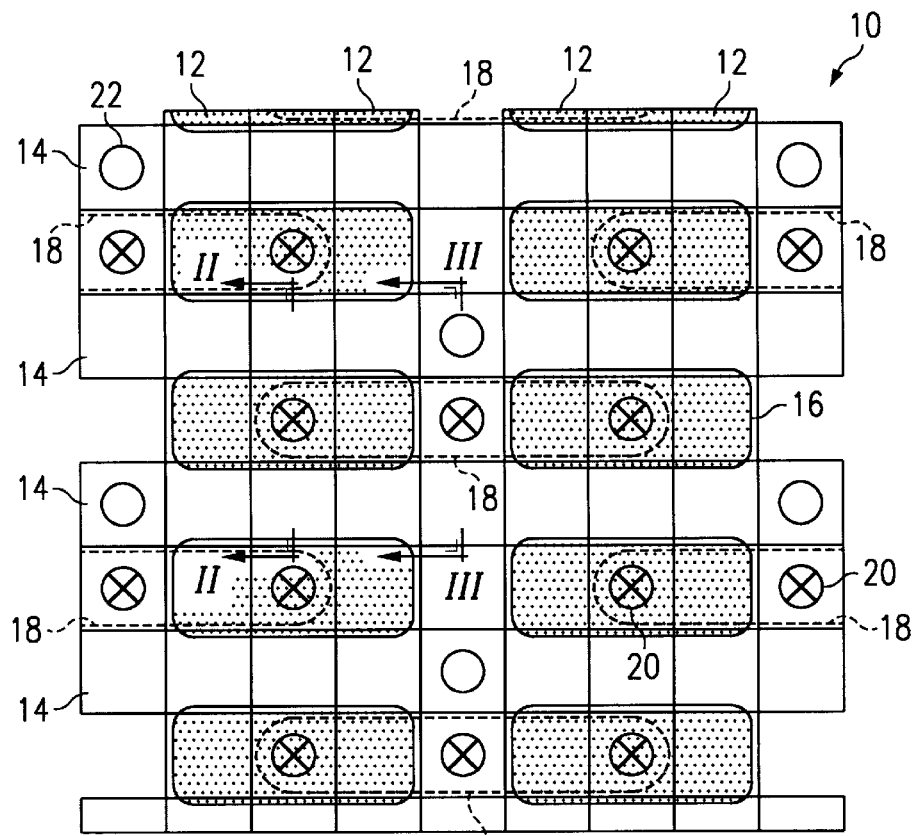
FIG. 1 is a plan view of a prior art DRAM device.

The dynamic random access memory (DRAM) device of the present invention will now be described with reference to FIGS. 4 and 30A–30D, initially. A first embodiment of the DRAM device, designated generally as 100, includes a substrate 102 of a semiconductor material, such as silicon. Also included are a plurality of active regions 104 extending outwardly from the substrate 102. Each of the active regions 104 has an outer surface 106 and has a longer dimension, designated as $D_L$ and a shorter dimension, designated as $D_S$, when viewed in plan as best seen in FIG. 4.

Device 100 also includes a plurality of substantially parallel word lines 108 which are located outwardly from the active regions 104 in a direction which is substantially parallel to the shorter dimension, $D_S$, of the active regions 104 and substantially perpendicular to the longer dimension, $D_L$, of the active regions 104. The word lines 108 are electrically isolated from each other, for example, by a region of silicon dioxide 110, or another suitable insulator. Intermediate portions of $Si_3N_4$ can also be provided, as shown in FIG. 30B, where they are designated by the reference character 112. During discussion of the manufacturing method below, the provision of regions 110 and 112 will be discussed further.

Figure 4:
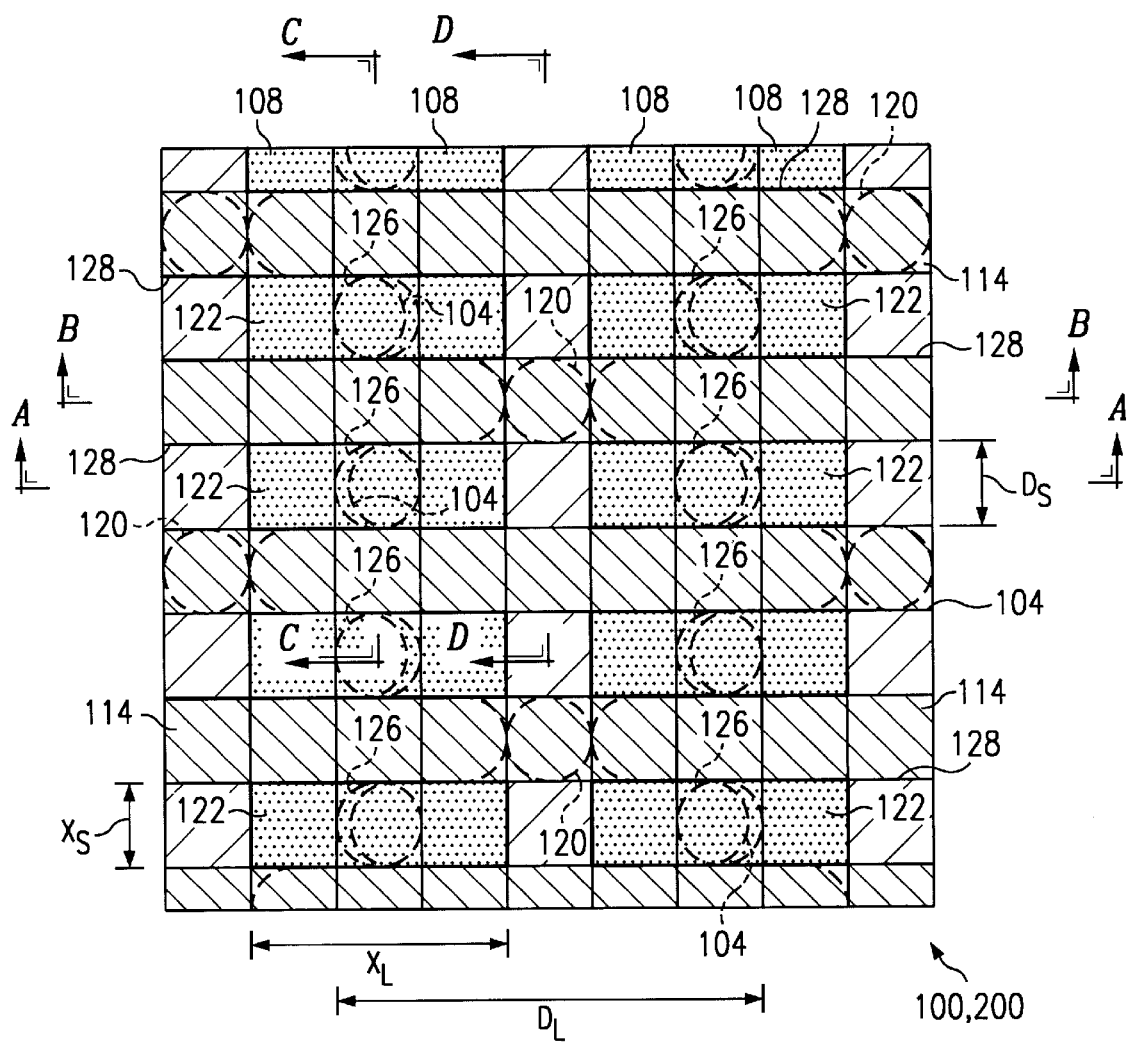
FIG. 4 is a top plan view of a DRAM device of the present invention.

With continued reference to FIGS. 4 and 30A, it will be seen that two of the word lines 108 are associated with each of the active regions 104, and that two of the word lines 108 are positioned between adjacent active regions 104.

Device 100 further includes a plurality of substantially parallel bit lines 114 which are located outwardly from the word lines 108 and are substantially perpendicular thereto. The bit lines 114 can be located between adjacent active regions 104 when viewed in plan, as best seen in FIG. 4, and the bit lines 114 can be electrically isolated from each other. Electrical isolation can be provided by suitable "caps" of silicon dioxide 116, or another convenient insulating material. Each of the bit lines 116 can be provided with an inward-projecting portion 118 for each of the active regions.

Device 100 can also include a plurality of unitary bit line contacts 120 which extend from the inward-projecting portions 118 of the bit lines 114 to associated ones of the active regions 104. Unitary bit line contacts 120 can be formed, for example, from doped polysilicon plugs. Portions 118 can be thought of as contacts which, together with the plugs, form complete bit line contact structures. As best seen in FIGS. 4 and 30D, which is a cross-section perpendicular to the bit lines 114, the unitary bit line contacts 120 can be offset when viewed in plan view (FIG. 4) or in cross-section perpendicular to the bit lines (FIG. 30D). By "offset" it is meant that the inwardly-projecting portion 118 of bit line 114 is not vertically aligned with the corresponding active region 104, but is interconnected thereto through the unitary bit line contact 120 with an offset between the active region 104 and the inwardly-projecting portion 118 of the bit line 114.

Device 100 yet further includes a plurality of storage nodes 122 which extend outwardly of the bit lines 114. Each of the storage nodes 122 has a longer and a shorter dimension when viewed in plan, such as FIG. 4. The longer dimension of the storage nodes 122, which is designated as $X_L$, is generally parallel to the longer dimension $D_L$ of the active regions 104, and the shorter dimension of the storage nodes 122, which is designated as $X_S$, is generally parallel to the shorter dimension $D_S$ of the active regions 104. At least substantial portions of the storage nodes 122 are located substantially directly outwardly of the active regions 104 when viewed in plan. As shown in FIG. 4, there is significant overlap between the storage nodes 122 and the active regions 104 at either end of the active regions 104. The directly outward location of the storage nodes with respect to the active regions is also well-illustrated in FIG. 30A, which is a cross-section perpendicular to the word lines 108. It will also be appreciated that storage nodes 122 can be located between the bit lines 114 when viewed in plan, as illustrated in FIG. 4. Each of the storage nodes 122 can be provided with an inward-projecting portion 124 which is associated with a given one of the active regions 104. Two of the storage nodes 122 can be associated with each of the active regions 104.

Device 100 can also include a plurality of unitary storage node contacts 126. One each of the storage node contacts 126 can extend inwardly from each of the inwardly-projecting portions 124 of the storage nodes 122 to a corresponding one of the active regions 104 with which a given one of the storage nodes 122 is associated.

Both the bit lines 114 and the inwardly-projecting portions 118 thereof can be formed of metal, and, as noted, the unitary bit line contacts 120 can be formed of doped polysilicon, in the form of doped polysilicon plugs. Further, the inwardly-projecting portions 124 of the storage nodes 122 can also be formed of metal and the unitary storage node contacts 126 can also be formed of doped polysilicon, for example, in the form of plugs of doped polysilicon. Portions 124 can be thought of as contacts which, together with the plugs, form complete storage node contact structures. The device 100 can be formed with a polysilicon-free region located between the bit line contacts 120, and substantially inward of the bit lines 114, in a direction which is substantially parallel to the long dimension $D_L$ of the active regions 104 and substantially perpendicular to the short dimension $D_S$ of the active regions 104. The polysilicon-free region can have a length which is greater than the longer dimension $D_L$ of the active regions 104. The polysilicon free regions can be seen in FIGS. 30C and 30D, wherein they are shown filled with, for example, $Si_3N_4$. Furthermore, with reference to FIG. 4, the oblong-shaped regions 128 can correspond to a special pattern mask, to be discussed below with respect to the manufacturing method, which prevents deposition of polysilicon.

The polysilicon-free region formed under the oblong regions 128 of the special mask can be longer than the long dimension $D_L$ of the active regions 104 for purposes of preventing shorting together of the polysilicon pads or plugs which could occur if the special pattern mask were misaligned during the photolithography process, and had substantially the same length as $D_L$. The active regions 104 can be formed from the same semiconductor material as the substrate 102, for example, from silicon. The word lines 108, as best seen in FIG. 30A, can comprise outer metal portions 130 and inner doped polysilicon portions 132. With particular reference to FIGS. 30A and 30B, the word lines 108 can be surrounded by silicon dioxide region 110, in the first embodiment of the device 100. Furthermore, in the first embodiment 100, adjacent ones of the storage node contacts 126 and adjacent ones of the bit line contacts 120 can be separated from each other by $Si_3N_4$ 112 when viewed in cross-section substantially parallel the word lines 108 and substantially perpendicular to the bit lines 114, as best seen in FIGS. 30C and 30D.

World lines 108 can be organized in a conventional fashion.

The inwardly-projecting portions 124 of the storage nodes 122 can be formed with a diameter which is reduced in comparison to a dimension of the unitary storage node contacts 126. This will be seen with respect to discussion of FIGS. 33 and 34 below. The reduced diameter of the inwardly-projecting portions 124 of the storage nodes 122 can be selected to have a value which is less than a given resolution limit of equipment (such as a stepper) which is used in manufacturing of the device 100. This provides benefits such as prevention of the portions 124 (which can be considered as contact portions) from projecting beyond the polysilicon pads or plugs due to misalignment.

Bit lines 114 can be formed from metal and can also function as inner portions of periphery circuit contacts.

A method, according to the present invention, of manufacturing the inventive dynamic random access memory device will now be described. Continued reference should be had to FIGS. 4 and 30-A through 30-D, and exemplary method steps for one possible manufacturing method, suitable for manufacturing the first embodiment 100 of the device, will be discussed in detail with respect to FIGS. 5–34.

The method comprises the steps of (a) providing a substrate 102 of semiconductor material having a main outer surface 134; (b) forming a plurality of active regions 104 from the semiconductor material; (c) forming a plurality of isolation regions (either LOCOS or trench isolation); (d) forming a plurality of substantially parallel word lines 108; (e) depositing a first word line insulation material; and (f) filling spaces between the word lines 108 with a second word line insulation material. The method also includes the steps of (g) applying a special pattern mask over portions of the second insulation material; (h) selectively etching the second word line insulation material to create a plurality of doped polysilicon receiving cavities; (i) depositing doped polysilicon in the receiving cavities; (j) simultaneously forming a plurality of inwardly-projecting bit line portions 118 and a plurality of inwardly-projecting storage node portions 124; (k) forming a plurality of substantially parallel bit lines 114; and (l) forming a plurality of storage nodes 122.

The active regions 104 can be formed such that they extend outwardly from the main outer surface 134 of the substrate 102, and each of the active regions 104 can have a longer and a shorter dimension $D_L$ and $D_S$ when viewed in plan, as discussed above. The isolation regions can be formed from an insulating material, such as silicon dioxide, and can comprise those portions of the silicon dioxide region 110 which separate adjacent active regions 104. The word lines 108 can be formed such that they are located substantially outwardly from the active regions 104 in a direction substantially parallel to the shorter dimension $D_S$ of the active regions 104 and substantially perpendicular to the longer dimension $D_L$ of the active regions 104. As discussed above with respect to the apparatus, two of the word lines 108 can be associated with each of the active regions 104 and two of the word lines 108 can be formed such that they are positioned between adjacent active regions 104.

In a first form of the method, which can be used to produce the first embodiment of the device 100, the first word line insulation material can be deposited so as to surround both the word lines 108 and portions of the DRAM device 100 where periphery circuit gate wiring is to be formed. It will be appreciated that the bit lines 114 can be used as the wiring for the periphery circuits, as discussed above.

The first word line insulation material, in the first embodiment, can be silicon dioxide which is deposited in silicon dioxide region 110. Spaces between the word lines 108 can be filled with a second word line insulation material which is selectively etchable with respect to the first word line insulation material. $Si_3N_4$, as depicted at 112, can be employed as the second word line insulation material in the step of filling the spaces between the word lines. In the step of applying the special pattern mask, the mask can be formed over portions of the second insulation material where the bit lines 114 (and periphery circuit wiring) are to be formed. Referring back to FIG. 4, the special pattern mask corresponds to the oblong regions 128.

The step of selectively etching the second word line insulation material can be done so as to create a plurality of doped polysilicon receiving cavities which correspond to the regions where the doped polysilicon plugs used to form the unitary bit line contacts 120 and unitary storage node contacts 126 are located. Thus, in the step of depositing the doped polysilicon in the receiving cavities, the plurality of unitary bit line contacts 120 can be formed. The unitary bit line contacts 120 can have outer surfaces (which will subsequently abut the inwardly-projecting portions 118 of the word lines 114) with one bit line contact 120 for each of the active regions 104. Further, when the doped polysilicon is deposited, the plurality of unitary storage node contacts 126 which are formed can also have outer surfaces, which will subsequently abut the inward-projecting portions 124 of the storage nodes 122, and the storage node contacts 126 can extend inwardly to corresponding ones of the active regions 104, with two of the storage node contacts (and thus two storage nodes, as discussed below) for each active region 104.

In step (j), the plurality of inwardly-projecting bit line portions 118 and the plurality of inwardly-projecting storage node portions 124 can be simultaneously formed, with one inwardly-projecting bit line portion 118 for each of the bit line contacts 120 and with one of the inwardly-projecting storage node portions 124 for each of the storage node contacts 126. Note that the bit lines are physically identical to the wiring in the periphery circuits and the bit line contacts are physically identical to the contacts for the periphery circuits.

In step (k) the bit lines 114 can be located outwardly from the word lines 108 and substantially perpendicular to the word lines, and the bit lines 114 can be located between adjacent ones of the active regions 104 when viewed in plan, as best seen in FIG. 4 (as discussed above). The bit lines 114 can be electrically isolated from each other and each of the bit lines 114 can be electrically interconnected with corresponding ones of the inwardly-projecting bit line portions 118. Finally, in step (l), the plurality of storage nodes 122 which are formed can extend outwardly of the bit lines 114, and each can have a longer and a shorter dimension $X_L$, $X_S$ respectively, as discussed above, when viewed in plan. As discussed above with respect to the apparatus, the longer dimension of the storage nodes can be generally parallel to the longer dimension of the active regions 104 and the shorter dimension of the storage nodes can be generally parallel to the shorter dimension of the active regions 104. Again, as set forth above with respect to the device, at least substantial portions of the storage nodes 122 can be located substantially directly outwardly of the active regions 104 when viewed in plan and can be located between the bit lines 114 when viewed in plan. The storage nodes 122 can be electrically interconnected with corresponding ones of the inwardly-projecting storage node portions 124.

In the first method, step (e) can include depositing the first word line insulation material as silicon dioxide, such as silicon dioxide 110, and step (f) can include filling the spaces between the word lines with the second insulation material, which can be the $Si_3N_4$ 112.

Step (j) can include simultaneously forming the plurality of inwardly-projecting bit line portions 118 and the plurality of inwardly-projecting storage node portions 124 of metal and step (k) can include forming the plurality of substantially parallel bit lines 114 of metal. Step (g) can include applying the special pattern mask (corresponding to the oblong regions 128 in FIG. 4) in regions between the bit line contacts 120, in a direction substantially parallel to the long dimension $D_L$ of the active regions 104 and substantially perpendicular to the short dimension $D_S$ of the active regions 104. Thus, no doped polysilicon receiving cavities are formed beneath the special pattern mask. Therefore, a polysilicon-free region can be located between the bit line contacts 120, substantially inwardly of the bit lines 114, and in a direction substantially parallel to the long dimension $D_L$ of the active regions 104 and substantially perpendicular to the short dimension $D_S$ of the active regions 104. The special pattern mask (again, corresponding to the oblong regions 128) can have a length greater than the longer dimension $D_L$ of the active regions 104, as best seen in FIG. 4. Thus, the polysilicon-free region will also have a length greater than the longer dimension of the active regions, since the length of the polysilicon-free region will correspond to that of the special pattern mask.

The steps of providing the substrate and forming the plurality of active regions can comprise forming both the substrate 102 and the active regions 104 from silicon. Further, the step of forming the word lines 108 can include forming them with the aforementioned outer metal portions 130 and inner portions of doped polysilicon 132.

In step (j), the inwardly-projecting storage node portions 124 can be formed with a diameter which is reduced in comparison to a dimension of the unitary storage node contacts 126, with the reduced diameter of the inwardly-projecting portions 124 being selected to have a value which is less than a given resolution limit of equipment (such as a stepper) used in manufacturing the device 100. It is desirable to form the projecting portions of the storage nodes (which interconnect with the polysilicon plugs forming the storage node contacts) in this fashion such that they will not inadvertently protrude into adjacent regions of the device 100. One specific sequence of optional steps which can be employed to obtain a reduced diameter for portions 124 will be discussed below with respect to FIGS. 18A–21A. Finally, in view of the foregoing discussion of the device, it will be appreciated that step (k) can include forming the plurality of bit lines 114 of metal, in a manner such that they are adapted to serve as inner portions of periphery circuit contacts.

Figure 5A:
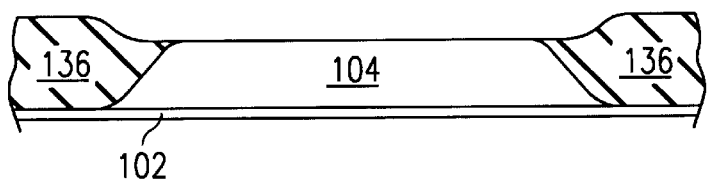
Figure 6A:
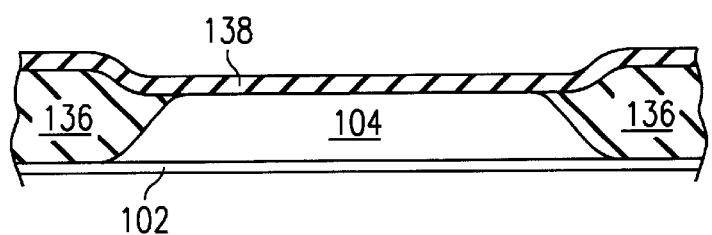
Figure 7A:
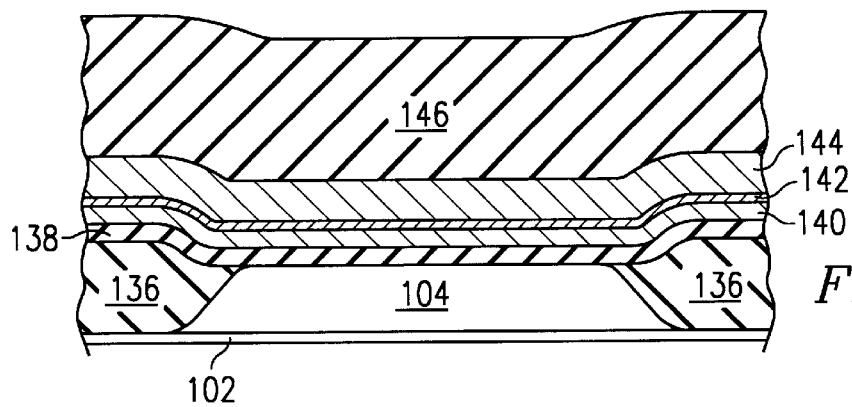

Attention should now be given to FIGS. 5A through 34, for a description of one specific manner in which the first manufacturing method of the present invention can be carried out. It should be noted that the specific method shown in the Figures is exemplary, and that the method can be implemented in other fashions as well. As shown in FIG. 5A, a substrate 102 can initially be provided and active regions 104 can be formed thereon. Further, suitable isolation regions 136 can be formed from silicon dioxide. An additional thin layer of silicon dioxide 138 can then be grown, as shown in FIG. 6A. With reference to FIG. 7A, a layer of doped polysilicon 140 can be deposited, followed by barrier metal 142, and a suitable low resistance material 144, such as metal. Subsequently an additional layer of silicon dioxide 146 can be deposited thereover.

Figure 8A:
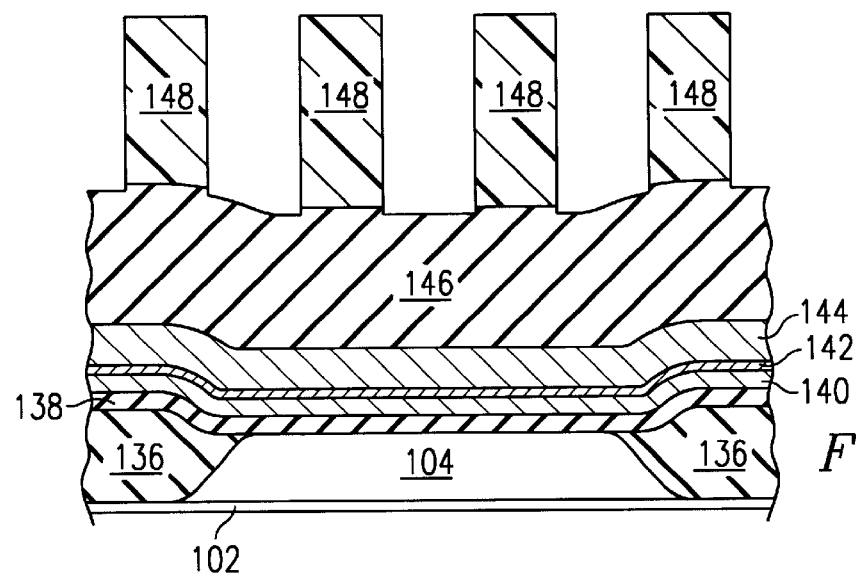
Figure 9A:
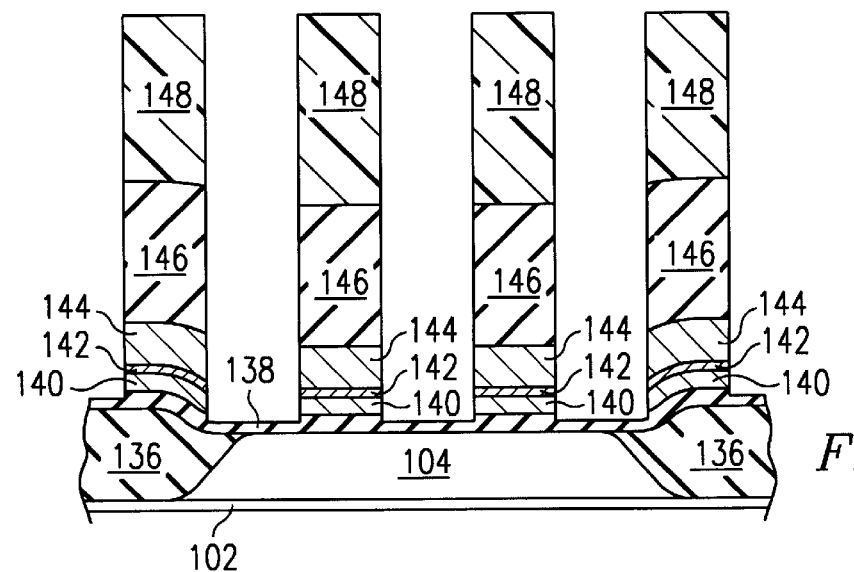
Figure 10A:
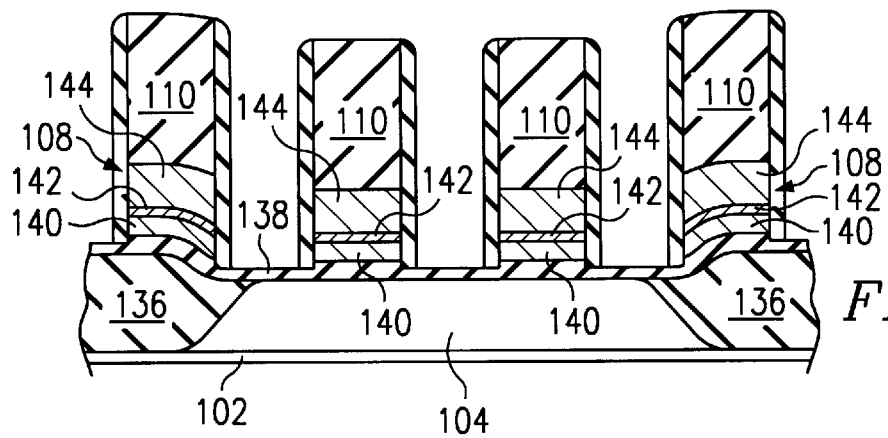
Figure 11A:
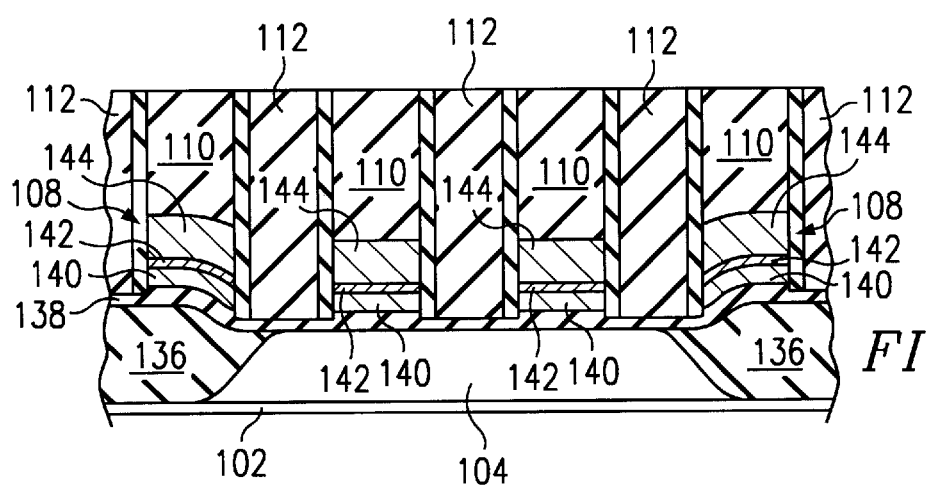
Figure 12A:
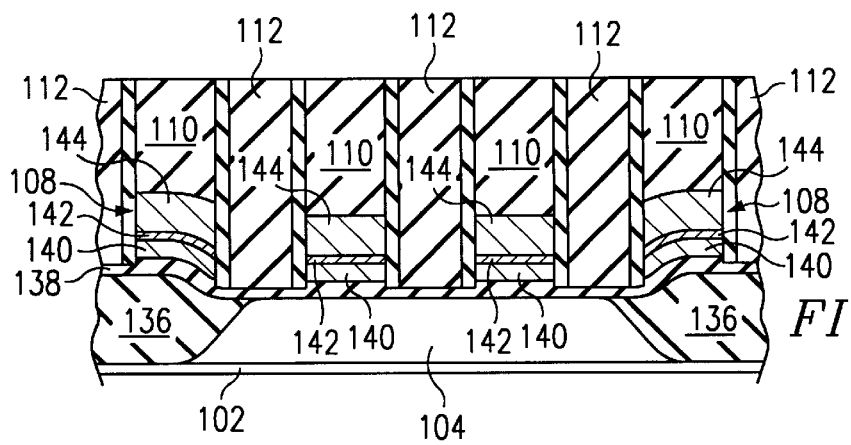
Figure 12B:
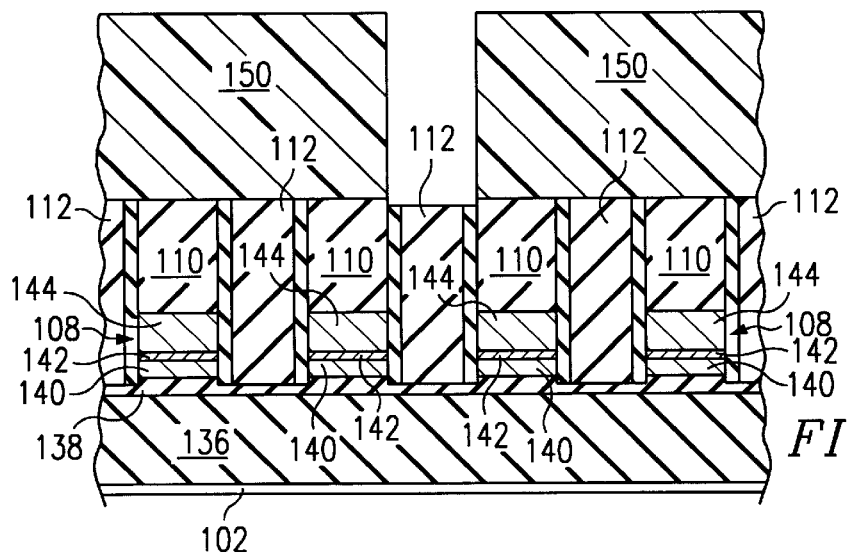
Figures 12C, 12D:
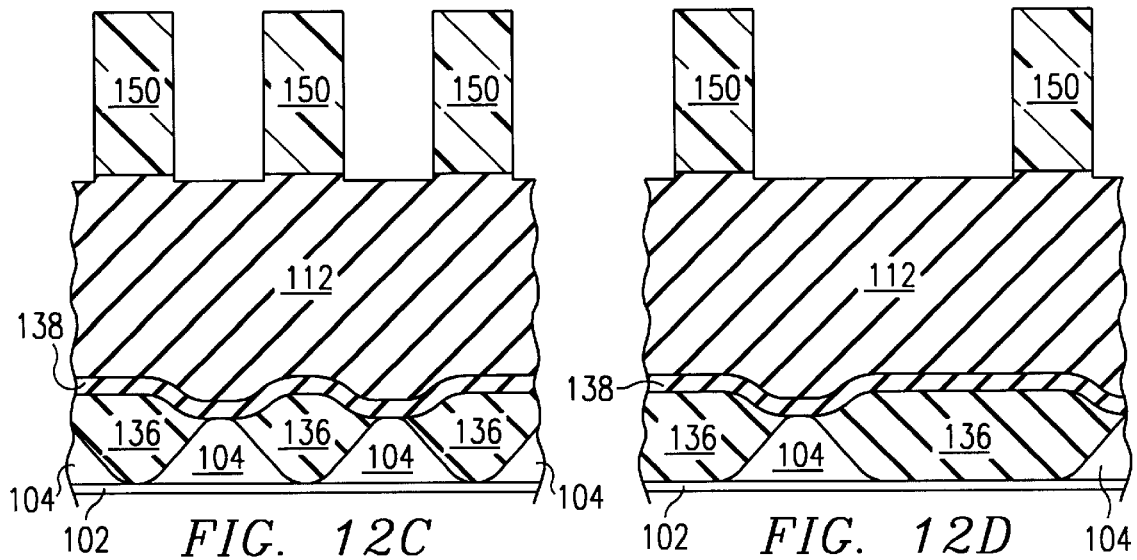

As shown in FIG. 8A, a suitable layer of photo resist 148 can be deposited and patterned using a mask to form the word lines. Subsequently, with reference to FIGS. 9A and 10A, the silicon dioxide layer 146, layer of low resistance material 144, barrier metal 142, and doped polysilicon 140 can be etched in those regions not protected by the mask of photo resist 148. The resulting word line structures 108 can then be surrounded with additional silicon dioxide to form the silicon dioxide regions 110. $Si_3N_4$ can then be deposited to form the $Si_3N_4$ region 112, with suitable planarization, as shown in FIG. 11A. At this point, the surface of the device is fully planarized, with silicon dioxide located over the word lines and the gate wiring in the periphery circuits and with $Si_3N_4$ elsewhere.

With reference to FIGS. 12A–12D, an additional layer of photo resist 150 can be applied and can be patterned using a mask for the above-discussed special pattern which corresponds to the oblong regions 128 in FIG. 4.

Figure 13A:
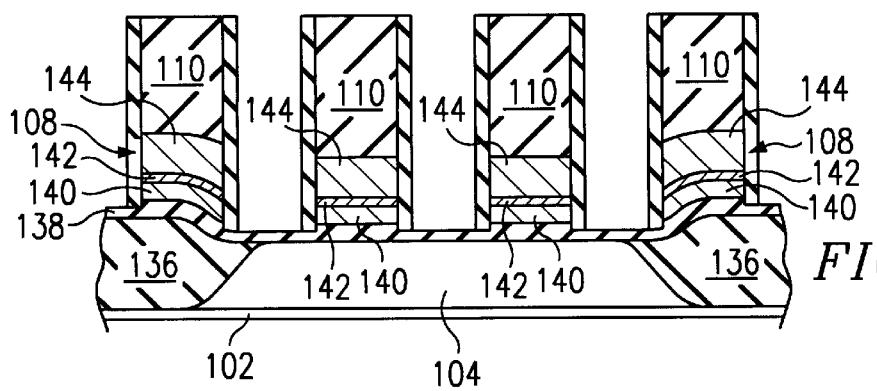
Figure 13B:
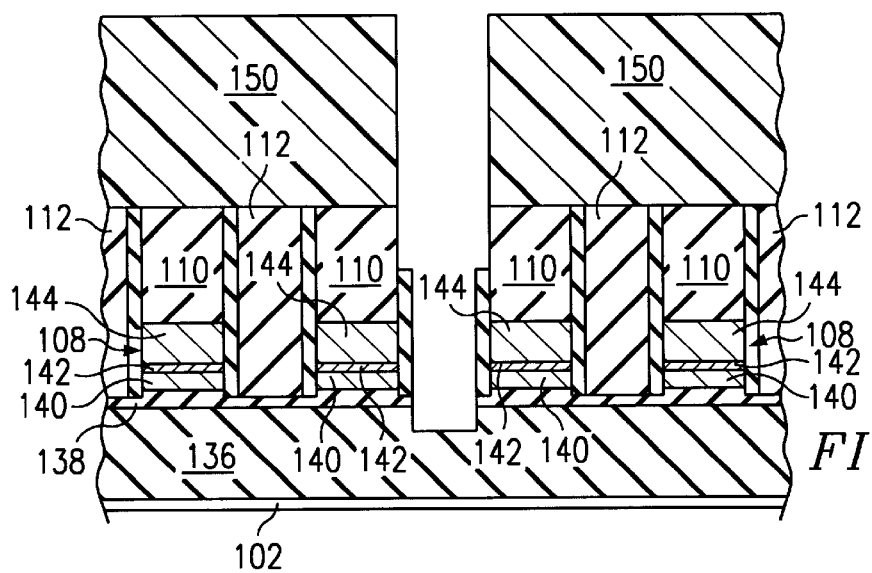
Figure 13C:
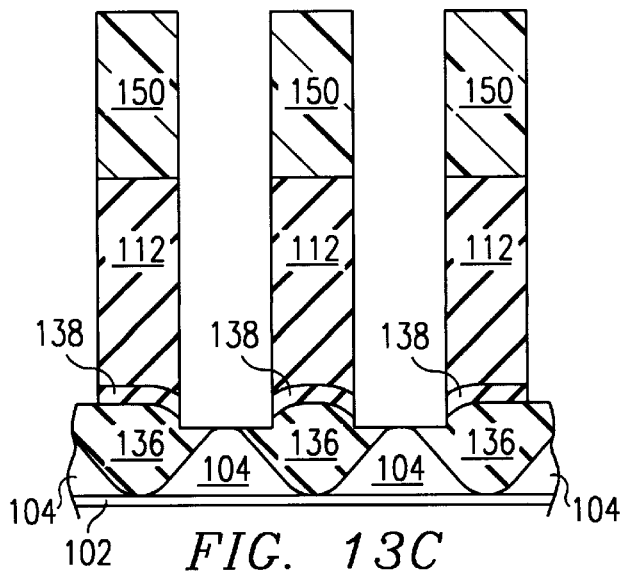
Figure 13D:
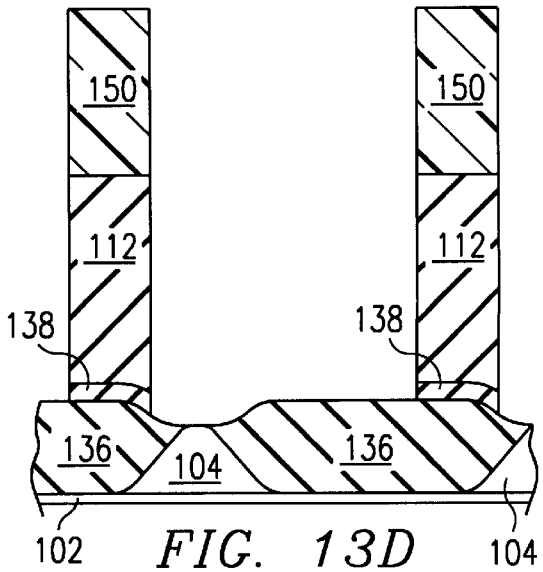
Figure 31:
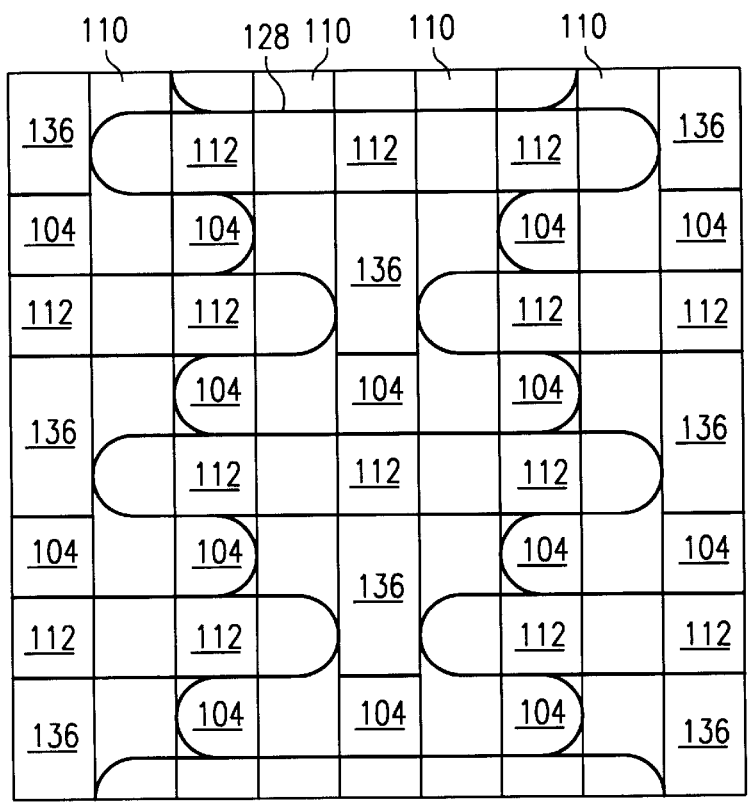
FIG. 31 is a top plan view of a DRAM device of the present invention undergoing fabrication.
Figure 32:
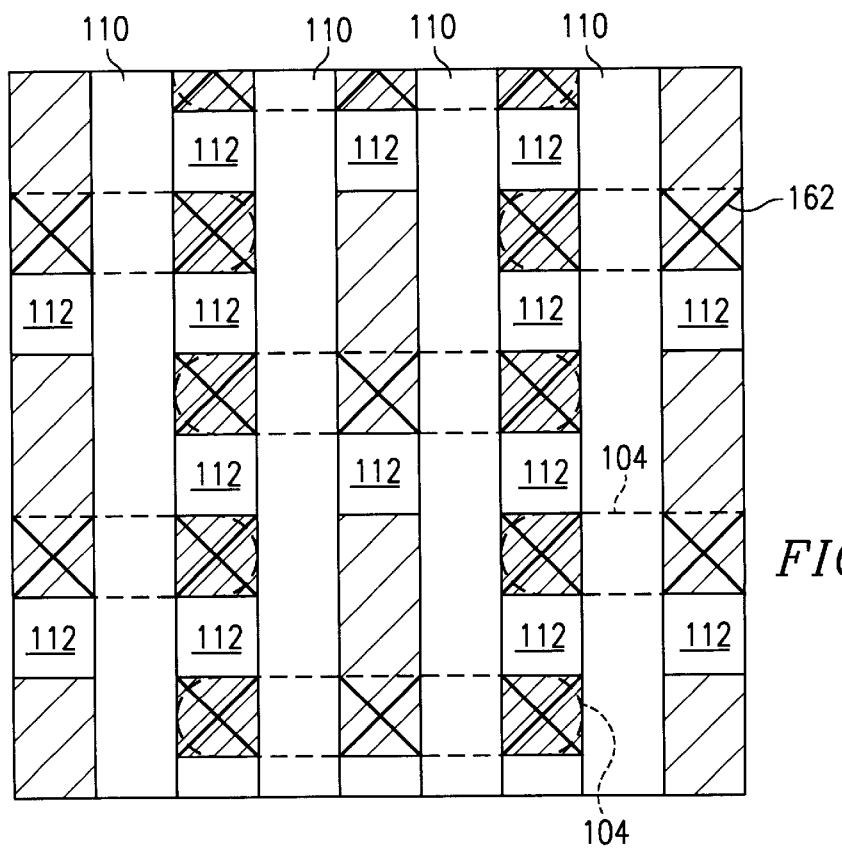
FIG. 32 is a view similar to FIG. 31 at a later stage of the manufacturing process.

Reference should now be had to FIGS. 13A–13D as well as FIG. 31 which is a top plan view of the device 100, undergoing manufacturing, at a time period corresponding to the cross-sections depicted in FIGS. 13A–13D. The $Si_3N_4$ is etched in a highly selective fashion with respect to the silicon dioxide region 110. Etching occurs where the surface is not silicon dioxide or is not covered with the special mask pattern. As seen in FIG. 13B, only a small etching of the silicon dioxide takes place while all of the $Si_3N_4$ 112 which is not protected by the photo resist 150 is etched away. FIG. 31 shows the silicon dioxide region 110, silicon nitride region 112, active regions 104, oblong regions 128 corresponding to the special mask pattern and isolation regions of silicon dioxide 136.

Reference should next be had to FIGS. 14A–14D and FIG. 32. The resist layer 150 is removed and doped polysilicon is deposited into the receiving cavities created during the etching of the $Si_3N_4$ previously discussed. This can followed by suitable planarization. Note that, throughout this application, planarization can be accomplished by any desirable method including, for example, CMP (chemical mechanical polishing). The regions designated by an "X" in FIG. 32 correspond to connecting points between the doped polysilicon, which forms the aforementioned bit line contacts 120 and storage node contacts 126, and the active regions 104. The doped polysilicon which forms the contact plugs is labeled as 162 in FIG. 32.

Figure 15A:
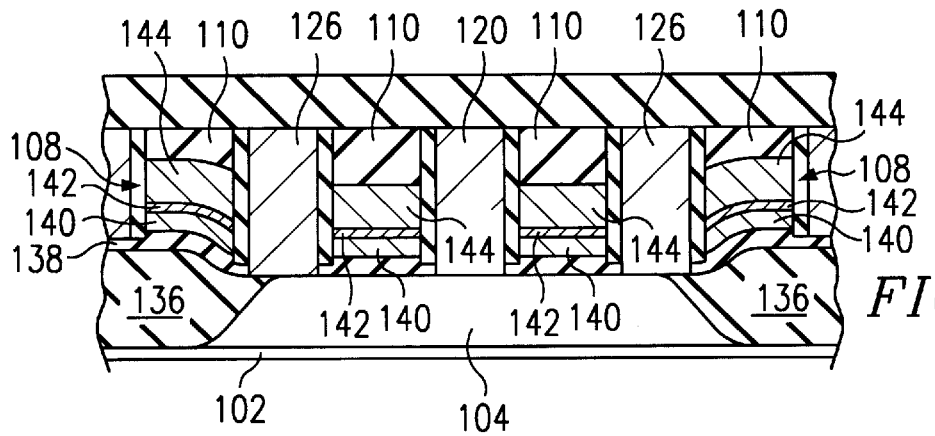
FIGS. 15A and 16A depict subsequent manufacturing steps viewed in cross-section along line A—A of FIG. 4.
Figure 16A:
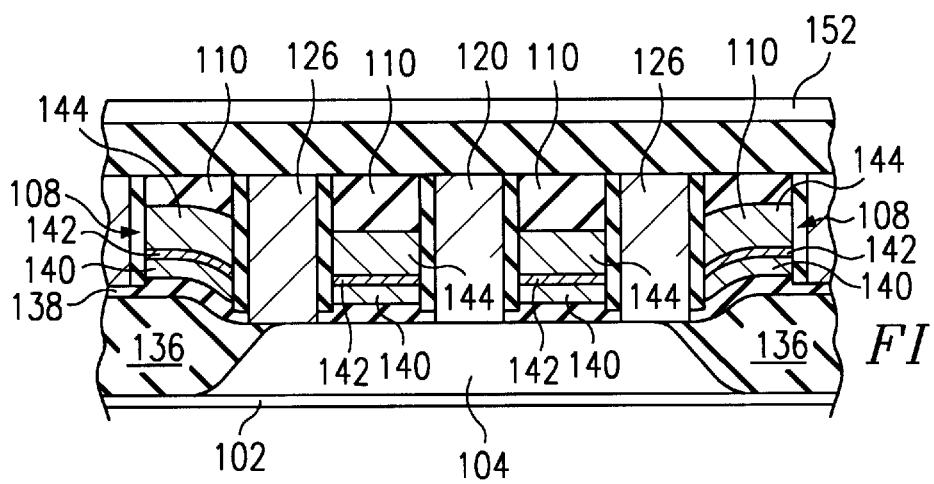
Figure 17A:
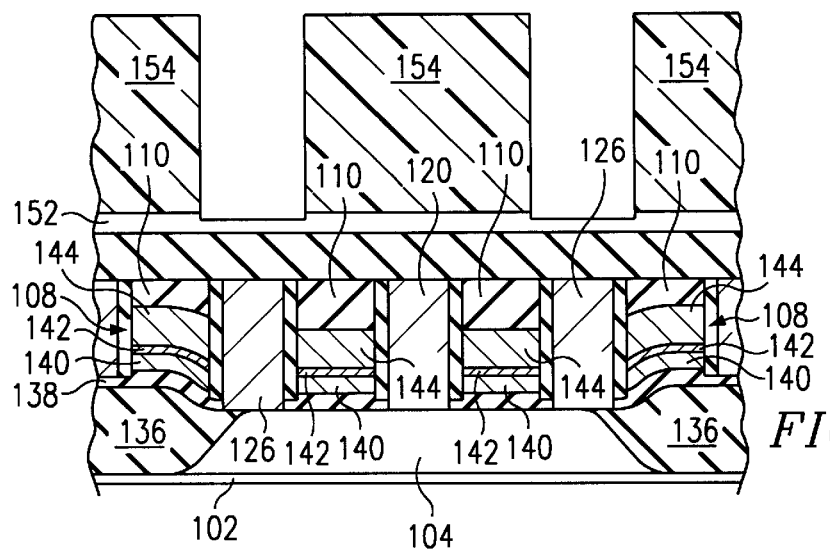
FIGS. 17A–17D depict a subsequent manufacturing step viewed in cross section along lines A—A, B—B, C—C and D—D respectively of FIG. 4.
Figure 17B:
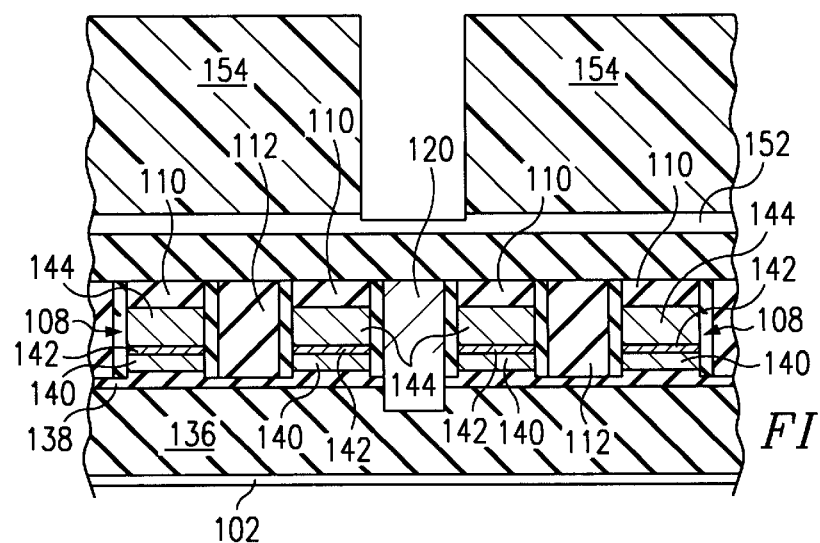
Figure 17C:
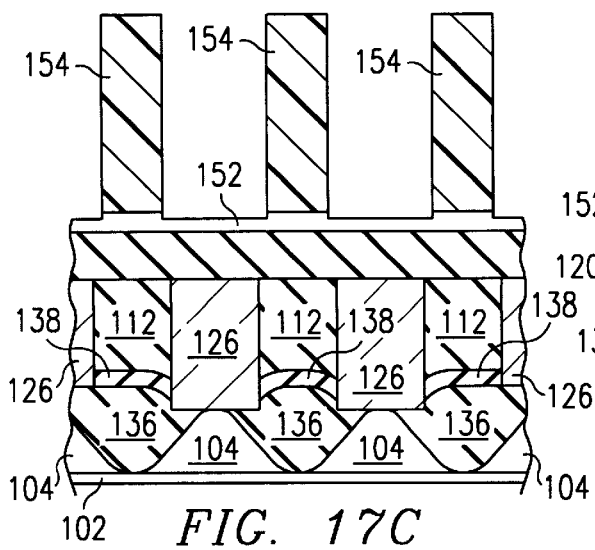
Figure 17D:
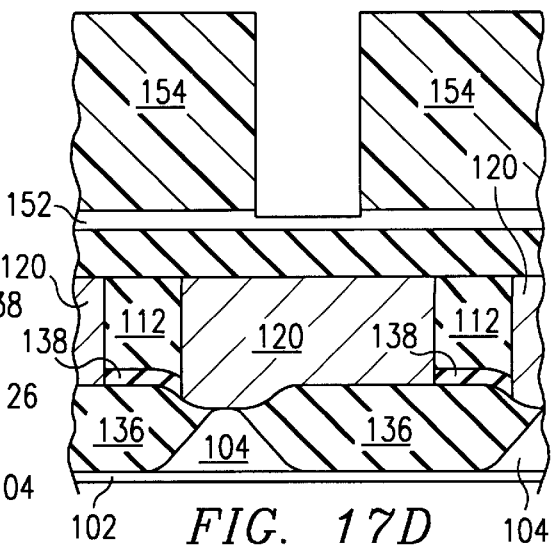
Figure 18A:
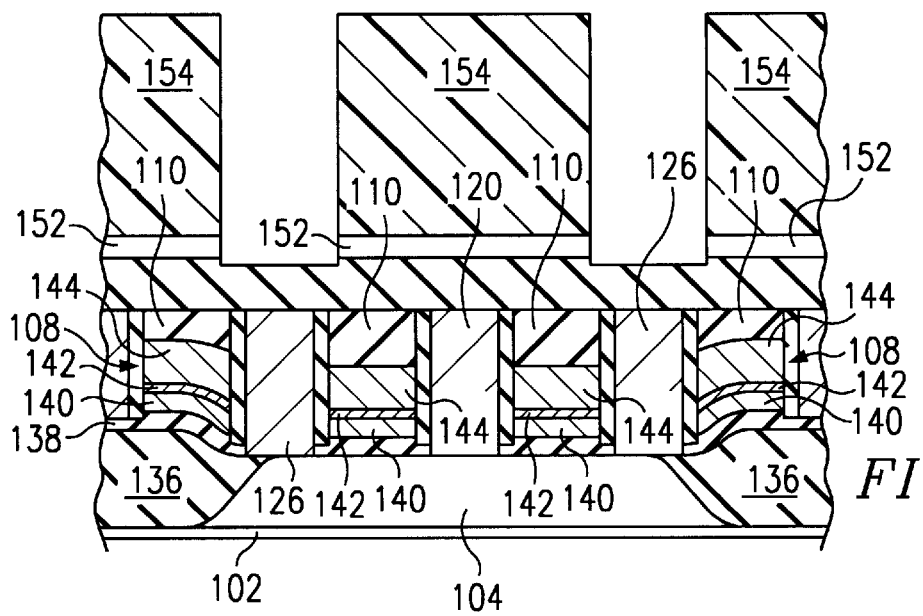
Figure 19A:
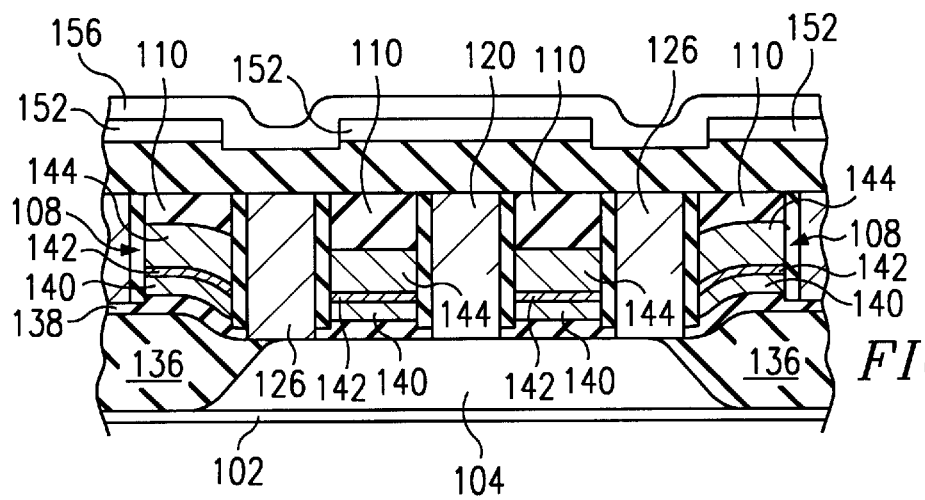

As shown in FIG. 15A, additional silicon dioxide can be added to the silicon dioxide region 110 and over the storage node contacts 126. Optionally, an additional layer of polysilicon 152 can be added as shown in FIG. 16A in order to assist in forming the inward-projecting storage node portions 124 with the reduced diameter discussed above. Further details regarding this process will be provided with reference to the following description of the subsequent figures. With reference to FIGS. 17A–17D, an additional layer of photo resist 154 can be added, and can be patterned using a mask for the storage node contacts 126 and bit line contacts 120. As shown in FIG. 18A, the additional polysilicon 152 can be etched, and then with reference to FIG. 19A, the additional photo resist 154 can be removed and yet a further layer of polysilicon 156 can be deposited. The additional polysilicon 156 builds up around the regions which were etched as shown in FIG. 18A to assist in forming the reduced diameter portions for the contacts mentioned above.

Figure 20A:
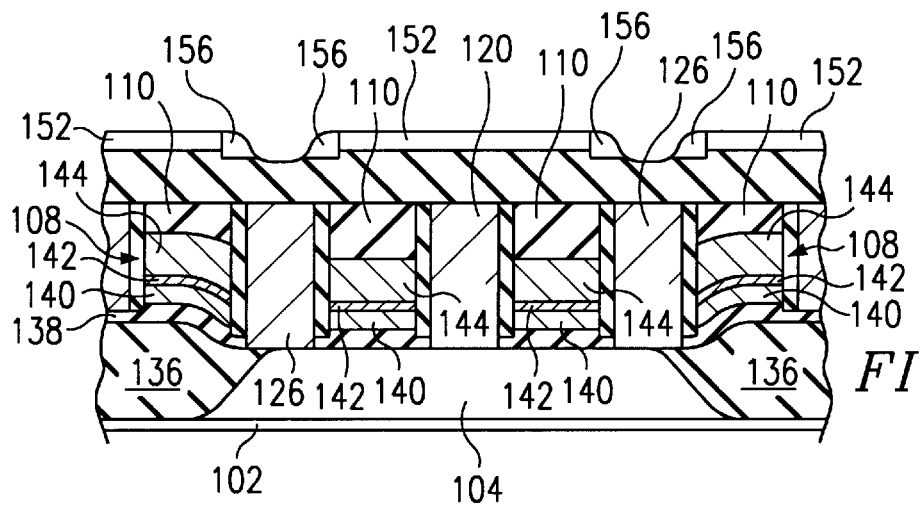
Figure 21A:
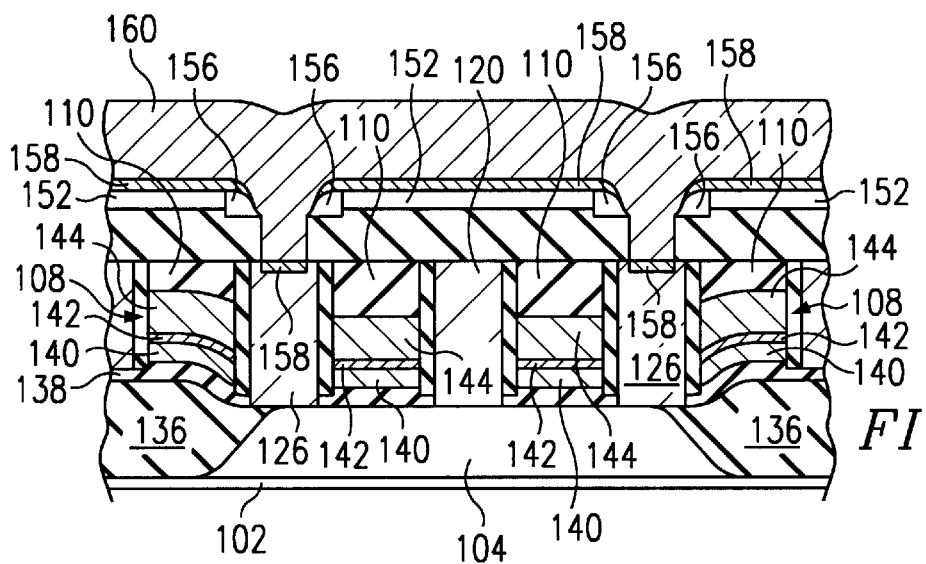
Figure 22A:
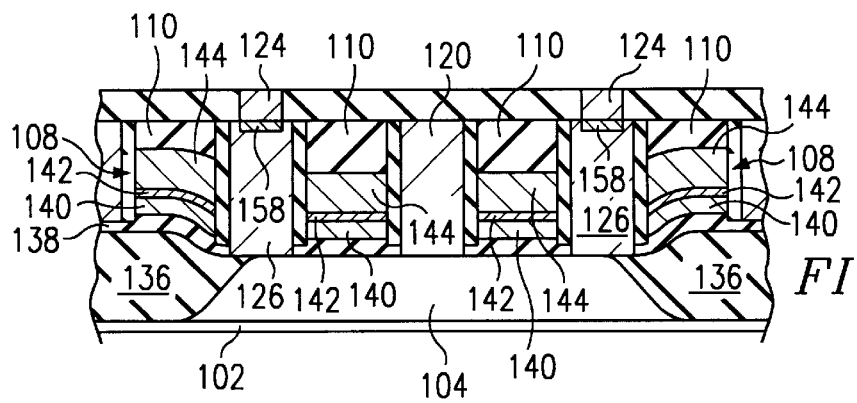
FIGS. 22A–22D depict an additional manufacturing step viewed along lines A—A, B—B, C—C and D—D respectively in FIG. 4.
Figure 22B:
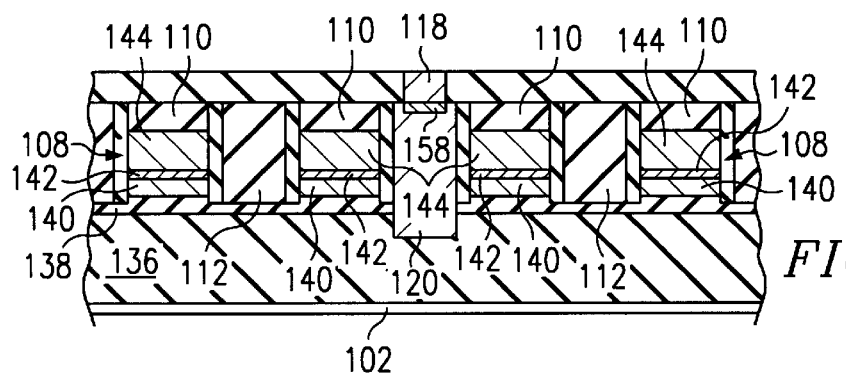
Figure 22C:
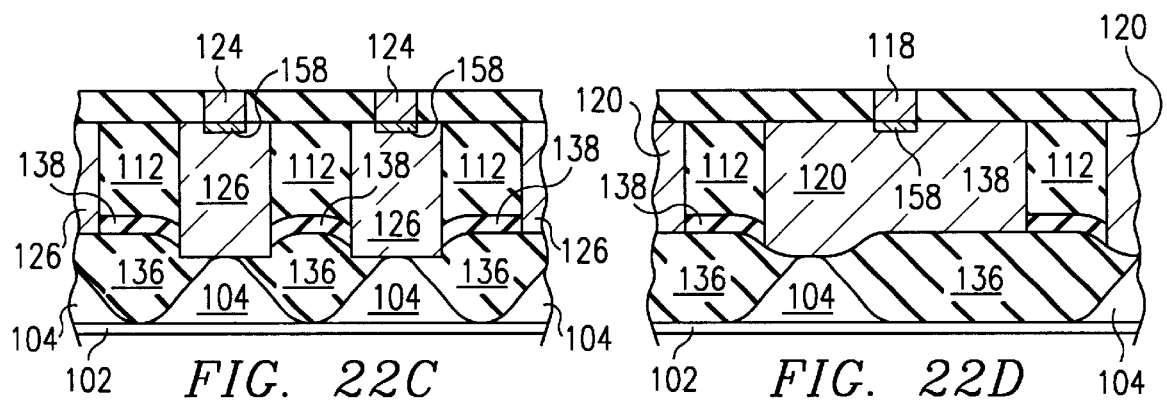
Figure 22D:
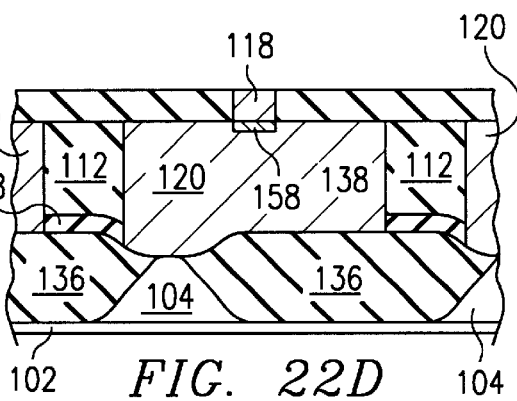
Figure 23A:
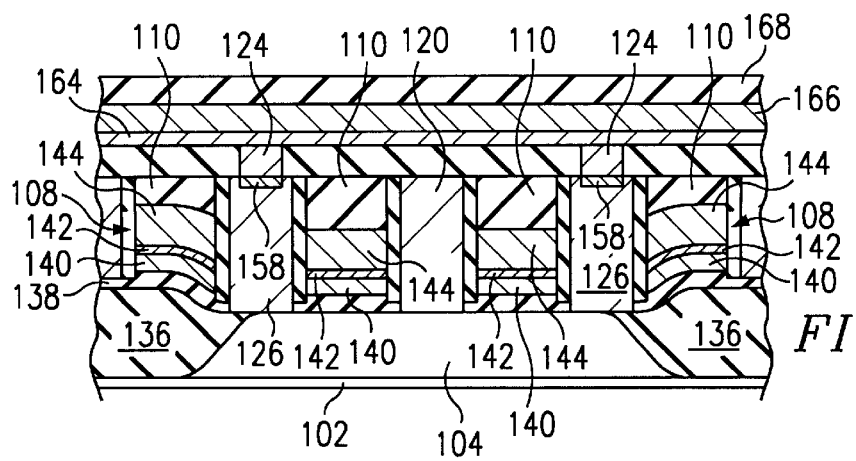
FIG. 23A depicts yet a further manufacturing step viewed along lines A—A in FIG. 4.
Figure 24A:
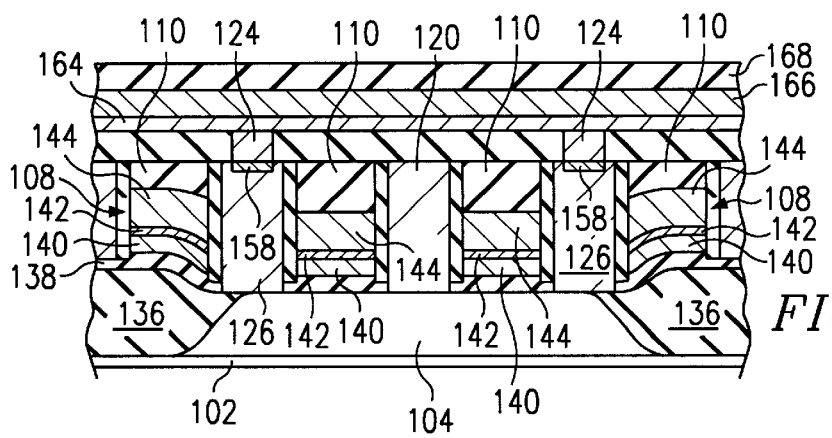
FIGS. 24A–24D depict a further manufacturing step viewed along lines A—A, B—B, C—C and D—D in FIG. 4.
Figure 24B:
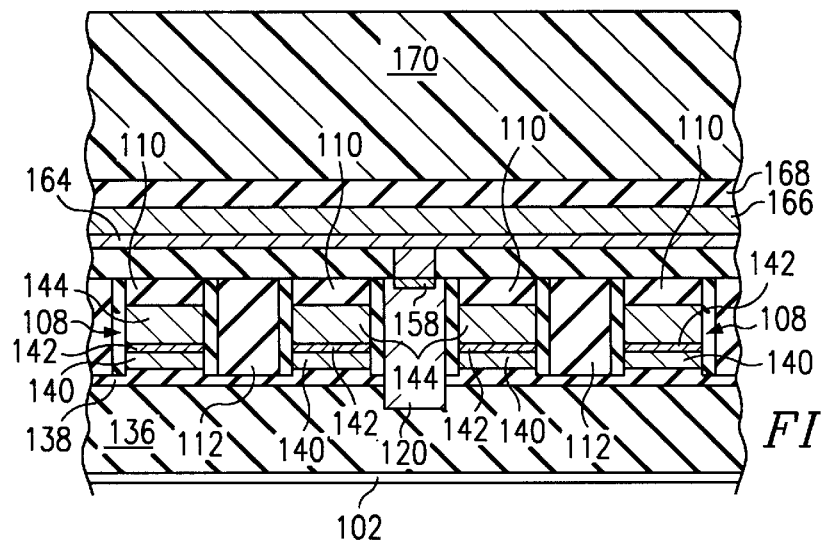
Figures 24C, 24D:
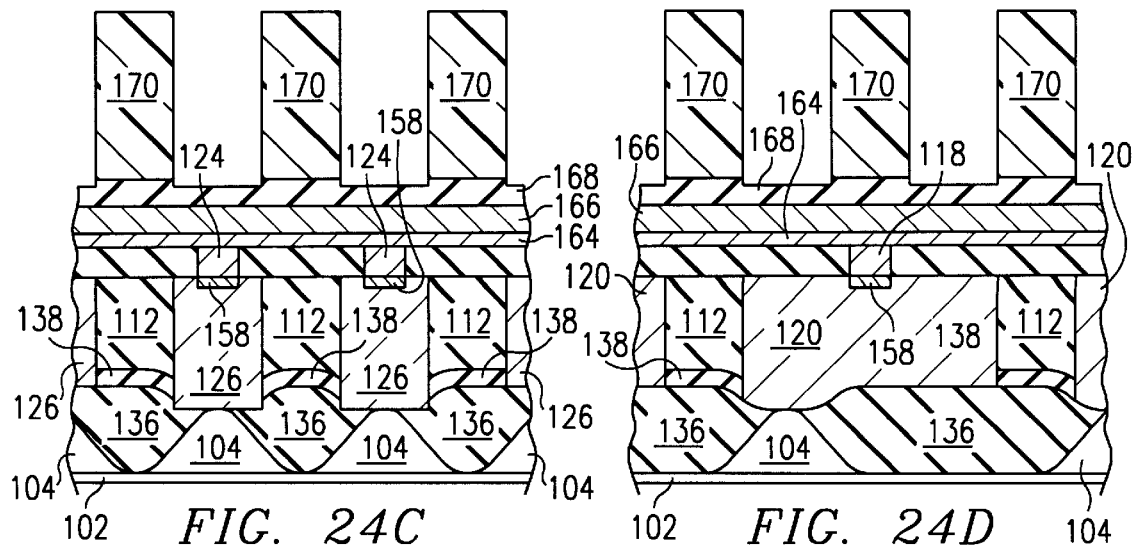
Figure 33:
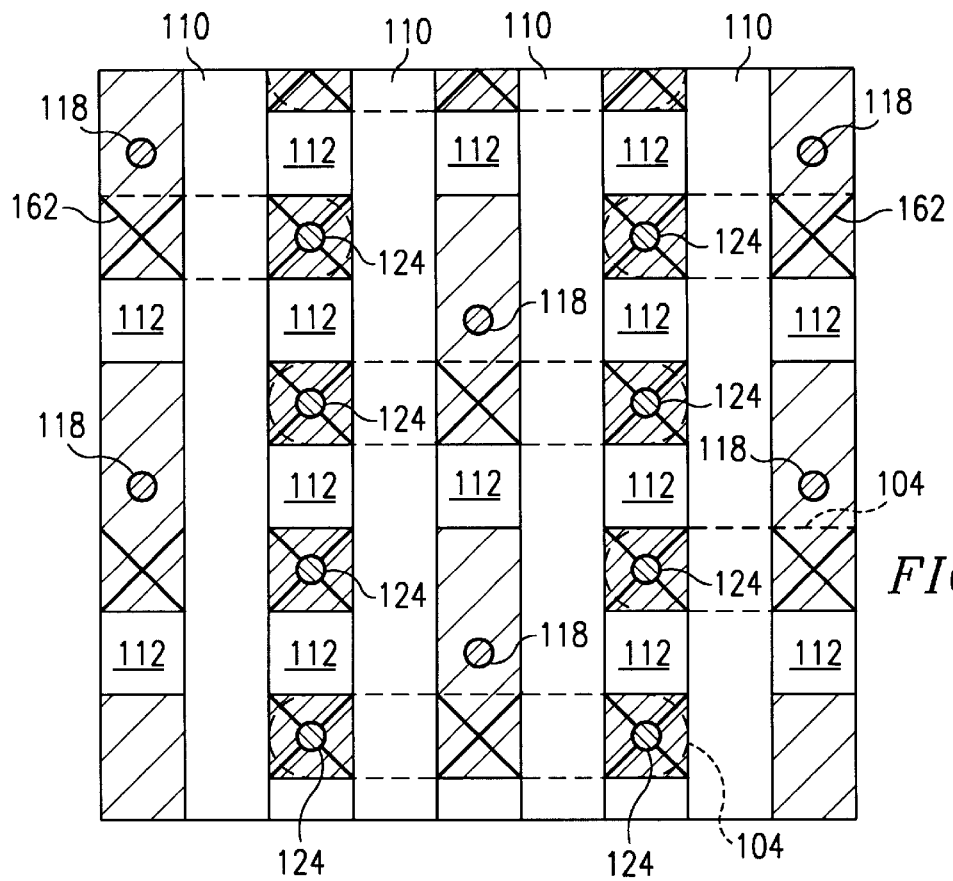
FIG. 33 is a view similar to FIGS. 31 and 32 at yet a further stage in the manufacturing process.

As shown in FIG. 20A, the polysilicon 156 and a portion of the polysilicon 152 can be etched back and then the silicon dioxide 110 can be etched down to the storage node contacts 126. It should be appreciated that, if it is desired to form reduced diameter portions associated with the bit line contacts, the same type of procedure can be carried out. A layer of barrier metal 158 can be deposited next and a layer of low resistence material 160 can follow. It will be appreciated that the method steps depicted in FIGS. 16A and 18A–20A are optional and are directed to producing the reduced diameter portions. If these optional steps are not carried out, with respect to FIG. 21A, once the silicon dioxide is etched, the layer of photo resist 154 is then removed. This can be followed by a suitable planarization process, such as CMP, as depicted in FIGS. 22A–22D. Reference should also be had to FIG. 33 which shows a top plan view of the structure undergoing fabrication at a point in time corresponding to FIGS. 22A–22D. The inward-projecting portions 124 of the storage nodes 122 and the inward-projecting portions 118 of the bit lines 114 are labeled in FIG. 33. It will be appreciated that the silicon dioxide region 110 the $Si_3N_4$ region 112 and the doped polysilicon 162 which forms the contact plugs for the storage node contacts and bit line contacts are shown in the Figure but would not in fact be visible at this point in the manufacturing process.

At this point, any suitable technique can be used to form the bit lines, which are also used as wiring for the periphery circuit. Further, any suitable process for applying the storage nodes can be performed. An exemplary fashion of accomplishing these functions will now be discussed with reference to FIGS. 23A and those following. As shown FIG. 23A, a suitable layer of barrier metal can be deposited followed by a suitable layer of low resistance material 166, such as metal. This can be followed by deposition of an additional layer of silicon dioxide 168. With reference to FIGS. 24A–24D, an additional layer of photo resist 170 can be applied and can be patterned using a suitable mask for the bit lines 114.

Figure 25A:
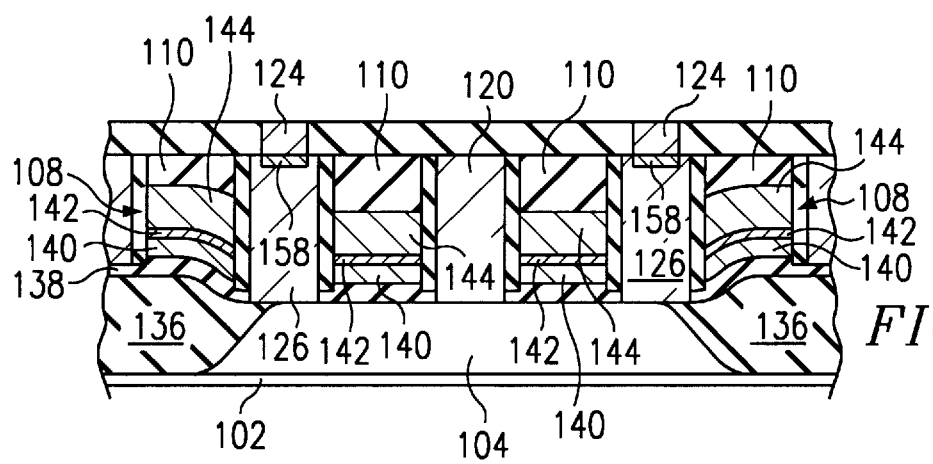
FIGS. 25A and 26A depict yet further manufacturing steps viewed along line A—A in FIG. 4.
Figure 26A:
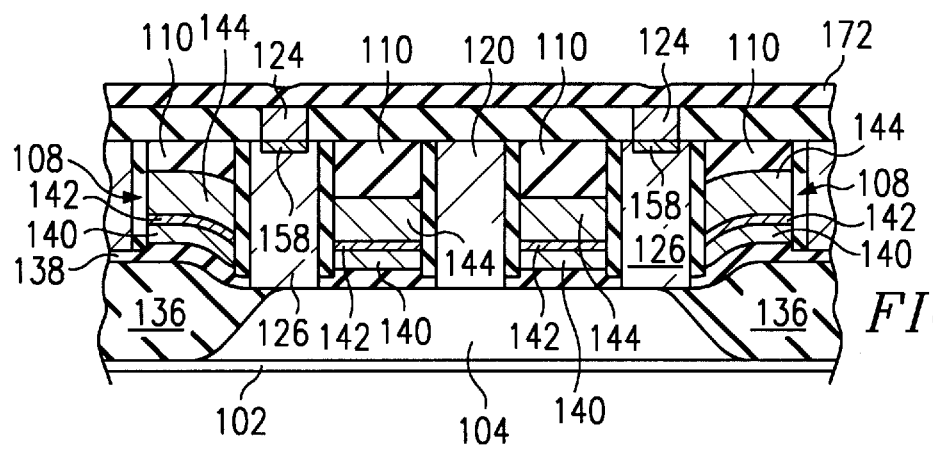
Figure 27A:
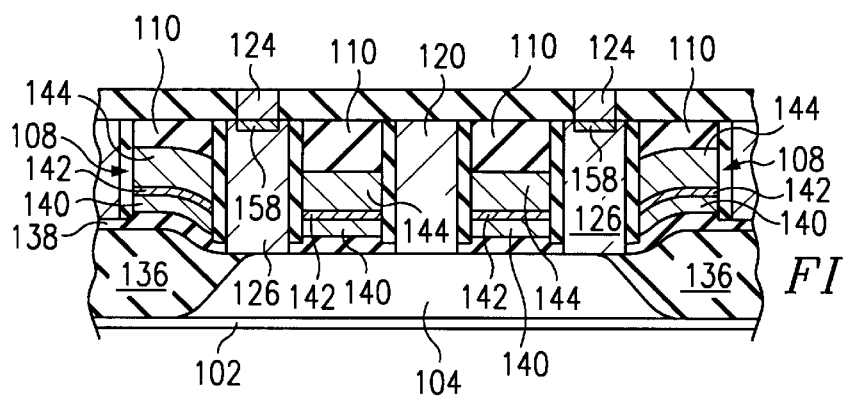
FIGS. 27A, 27C and 27D depict a further manufacturing step viewed along lines A—A, C—C and D—D in FIG. 4.
Figure 27C:
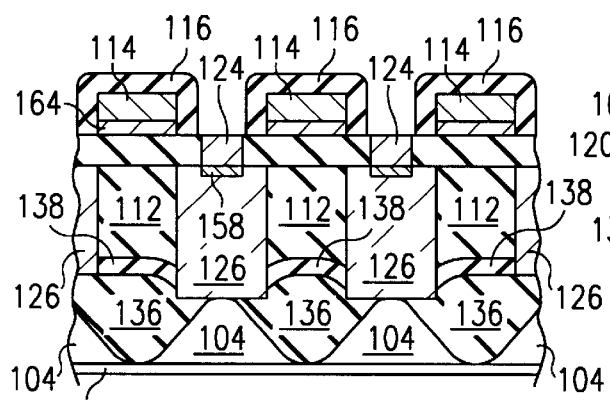
Figure 27D:
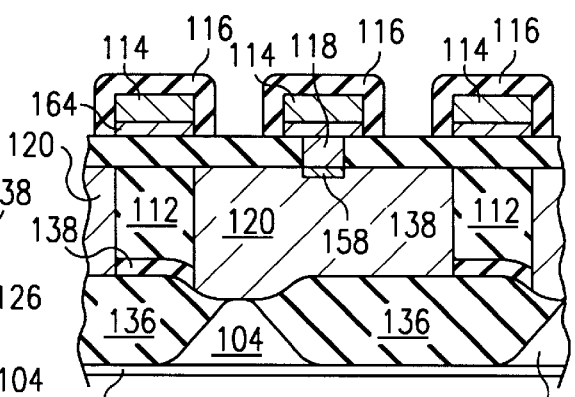

As shown in FIG. 25A, the silicon dioxide 168, low resistance material 166 and barrier metal 164 can be etched away in those regions where they are not protected by the resist 170 which is used to pattern the bit lines. With reference to FIGS. 26A, 27A, 27C and 27D, a further layer of silicon dioxide 172 can be deposited and can then be etched back to form the silicon dioxide bit line caps 116.

Figure 28A:
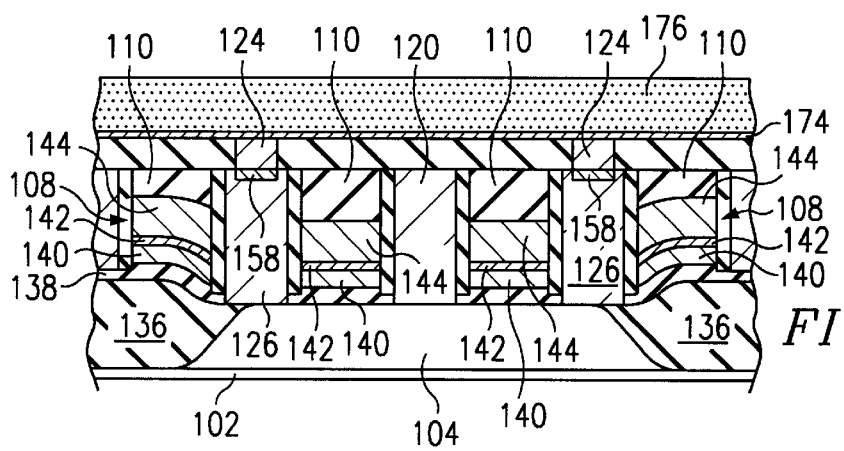
FIG. 28A depicts a further manufacturing step viewed along line A—A in FIG. 4.
Figure 29A:
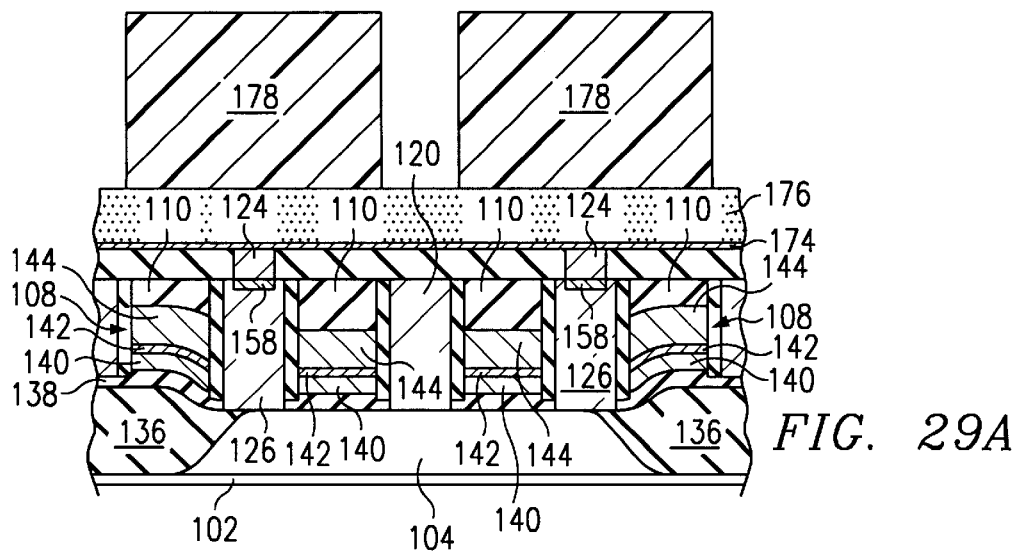
Figure 29B:
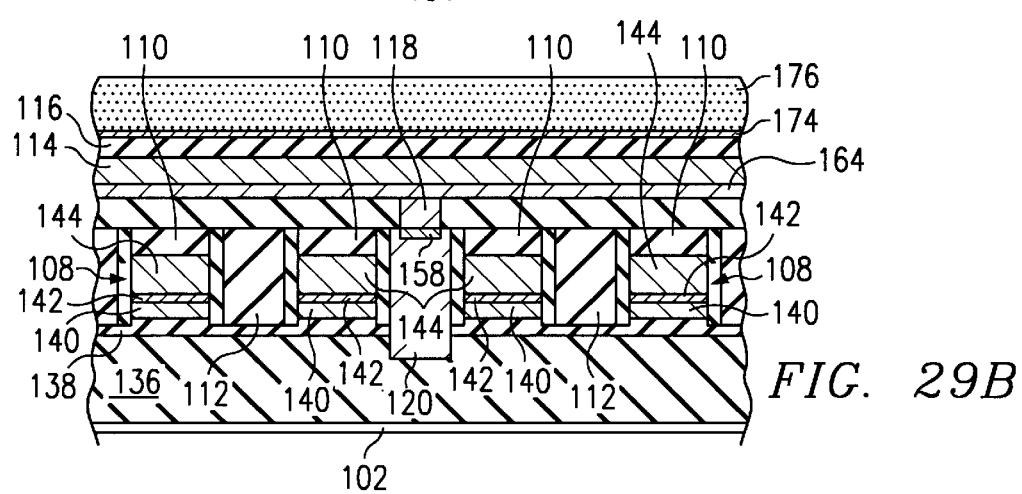
Figures 29C, 29D:
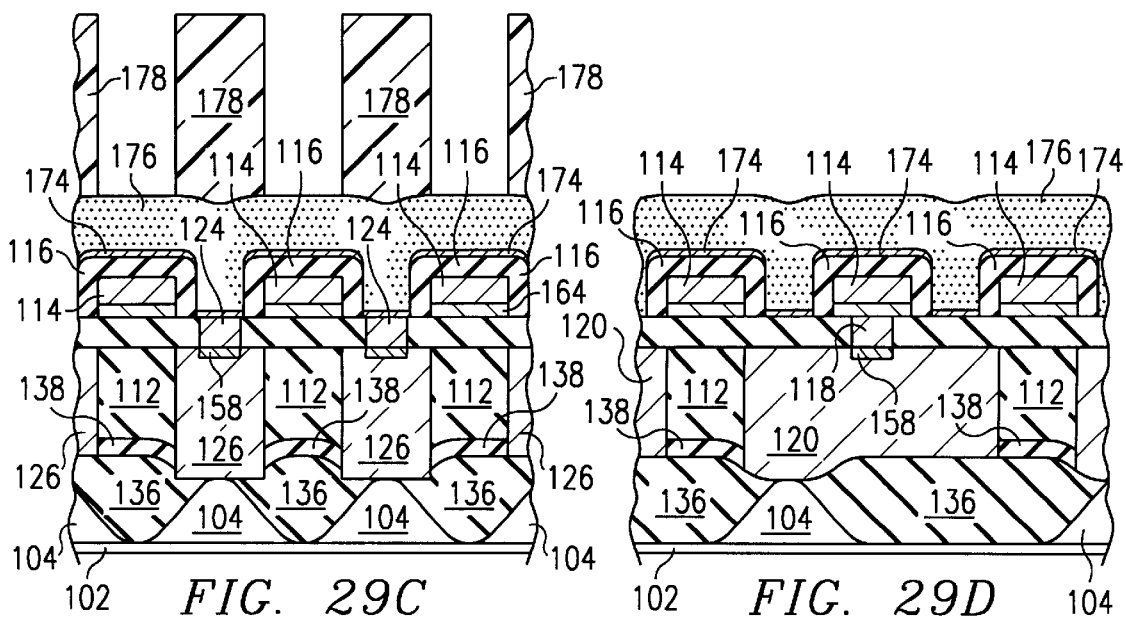

Referring now to FIG. 28A, an additional layer of barrier metal 174 can optionally be applied, followed by suitable storage node material 176. Then, with reference to FIGS. 29A–29D, a final layer of photo resist 178 can be applied and can be patterned to form the storage nodes 122. Finally, with reference to the previously-described FIGS. 30A–30D, the storage node material 176 can be etched, and the optional barrier metal 174 can also be etched, followed by removal of the photo resist 178, to obtain the previously-described structure. FIGS. 30A–30D should also be compared to FIG. 34, which is a plan view of the DRAM device after the steps depicted through FIGS. 30A–30D have been accomplished.

Figure 2:
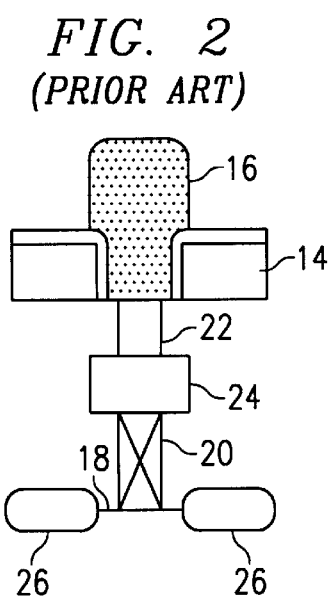
FIG. 2 is a cross-sectional view of the device of FIG. 1 taken along line II—II.
Figure 3:
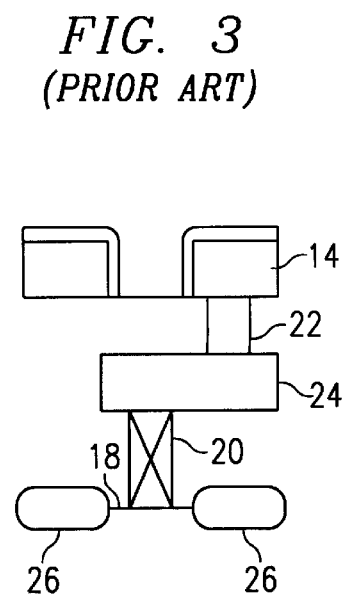
FIG. 3 is a cross-sectional view of the device of FIG. 1 taken along line III—III in FIG. 1.
Figure 34:
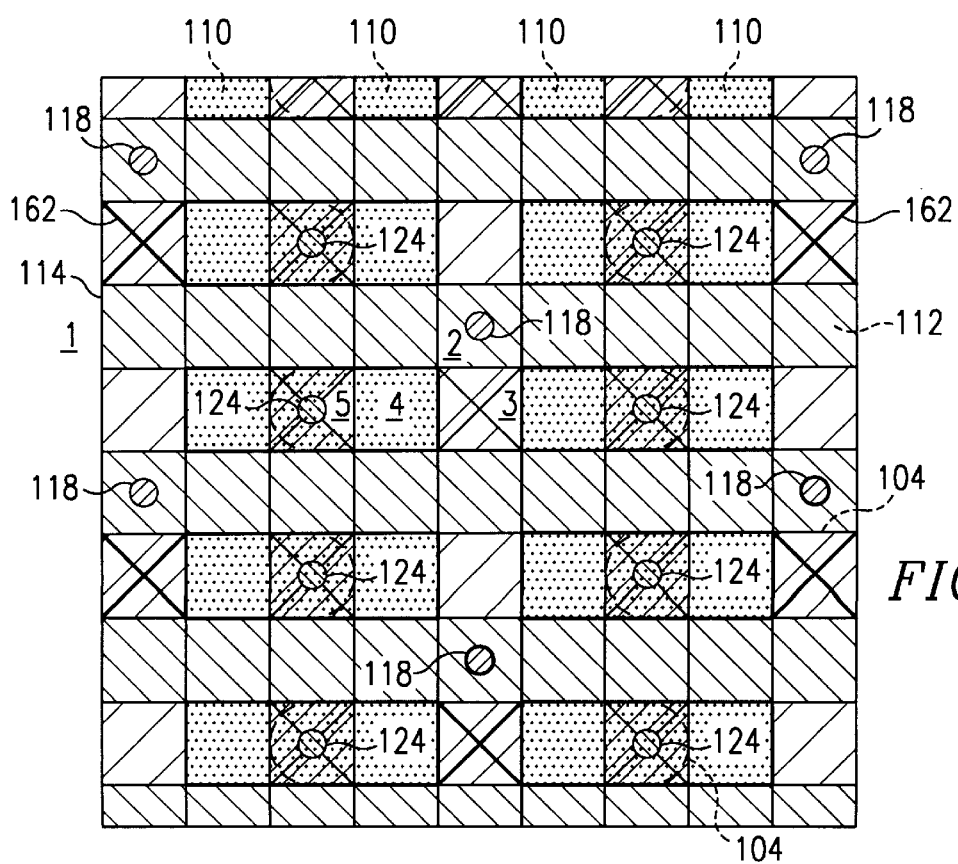
FIG. 34 is a top plan view of the device of the present invention following formation of the bit lines and the storage nodes.
Figure 35A:
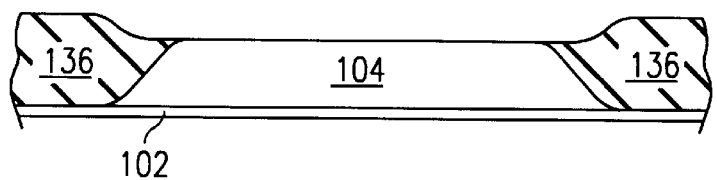
Figure 36A:
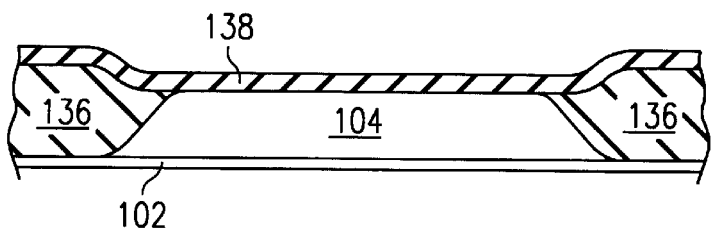
Figure 37A:
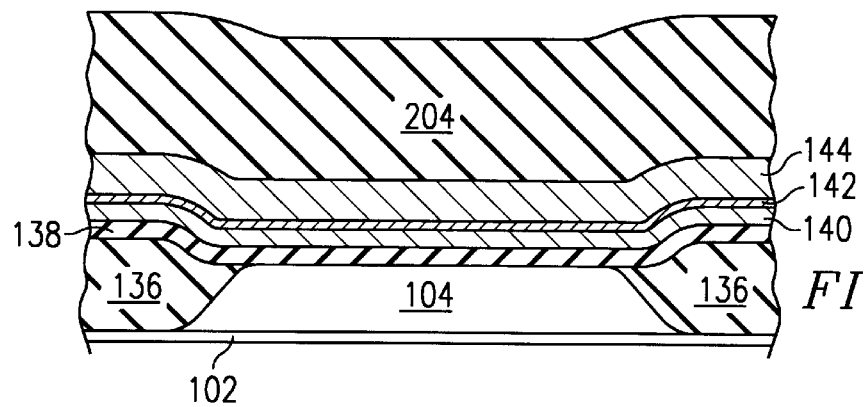
Figure 38A:
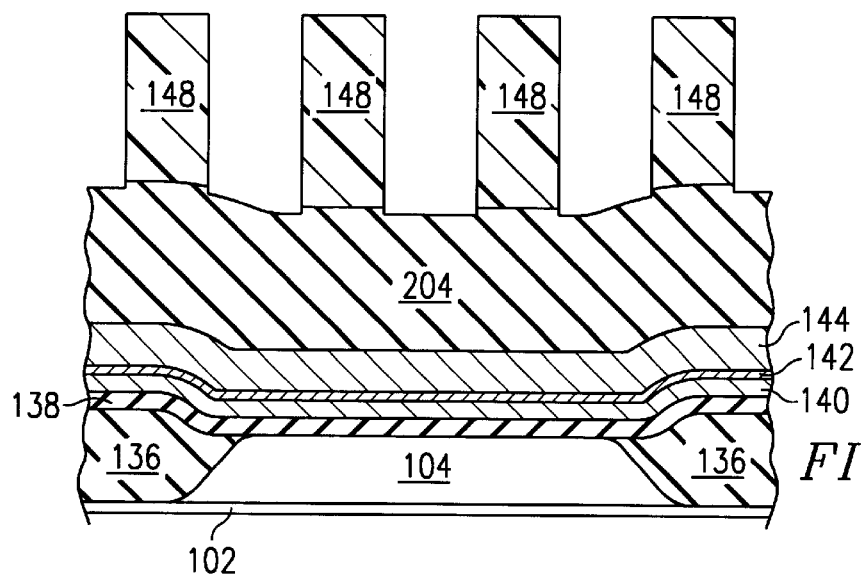
Figure 39A:
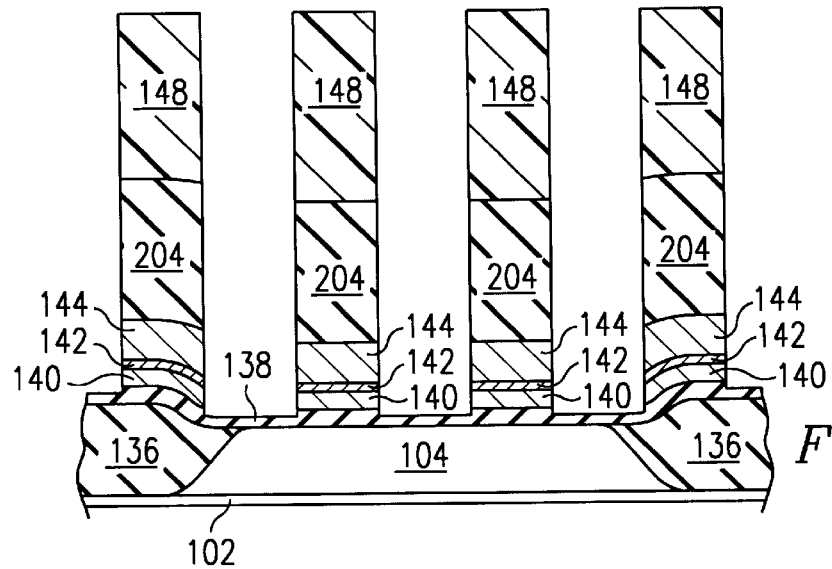

For illustrative purposes, the transmission path from the bit line to a given storage node is traced in FIG. 34. Charge at location 1 passes through a given one of the bit lines 114, through the doped polysilicon layer at numeral 2, and through the storage node contact 126 and bit line contact 120 (which is also the contact for the periphery circuit). As indicated at numeral 3, there is subsequent transmission to the active region 104 for connection of the bit line 114, transmission to the transfer gate, indicated by numeral 4 adjacent the given active region 104, and then, as indicated by numeral 5, from the given active region to a given one of the storage nodes 122 through the doped polysilicon layer. It will appreciated that the contacts 126 in FIG. 30C replace items 24 and 20 in FIG. 2. Further, the contact 120 in FIG. 30D replaces elements 24 and 20 in FIG. 3.

Reference should now be had to FIGS. 60A–60D which illustrate an alternative form of device according to the present invention. With reference also to FIG. 4, the alternative form of device is designated generally as 200. The view shown in FIG. 4 is illustrative of both embodiments 100, 200. With reference to FIGS. 60C and 60D, and with comparison to FIGS. 30C and 30D, it will be appreciated that the views are essentially identical, except that the $Si_3N_4$ regions 112 of FIGS. 30C and 30D are replaced by silicon dioxide. Furthermore, with comparison of FIGS. 60A and 60B with FIGS. 30A and 30B, it will be appreciated that the word lines 108 depicted in FIGS. 60A and 60B have outward and side regions surrounded by $Si_3N_4$, labeled as item 202, when viewed in cross-section substantially parallel to the bit lines 114 and substantially perpendicular to the word lines 108. Further, as previously discussed, the storage node contacts 126 and the bit line contacts 120 are respectively separated from each other by silicon dioxide when viewed in cross-section substantially parallel to the word lines 108 and substantially perpendicular to the bit lines 114, as seen in FIGS. 60C and 60D.

With reference to the foregoing discussion, it will be appreciated that an alternative form of method according to the present invention can be essentially similar to that broadly described above with respect to steps (a) through (l), except that step (e) can comprise depositing the first word line insulation material as $Si_3N_4$, in order to form the regions 202, and step (f) can comprise filling the spaces between the word lines with the second word line insulation material as silicon dioxide, to form the silicon dioxide region 110 illustrated in FIGS. 60A–60D.

Figure 40A:
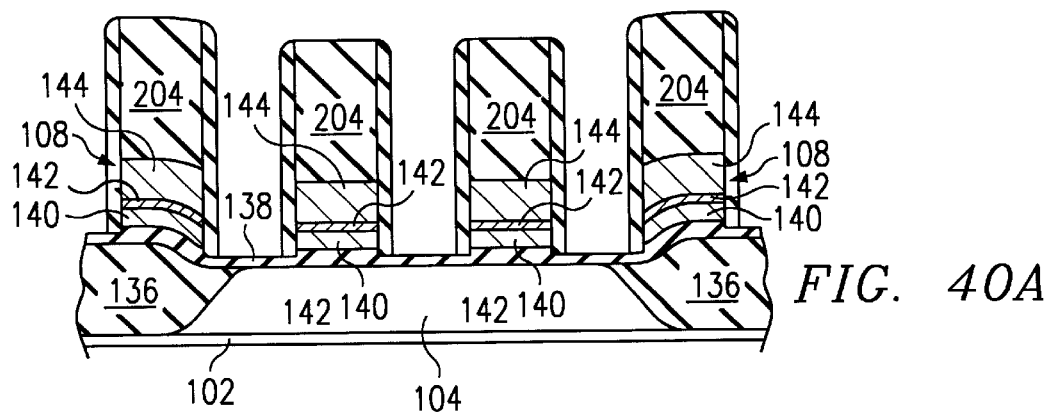
Figure 41A:
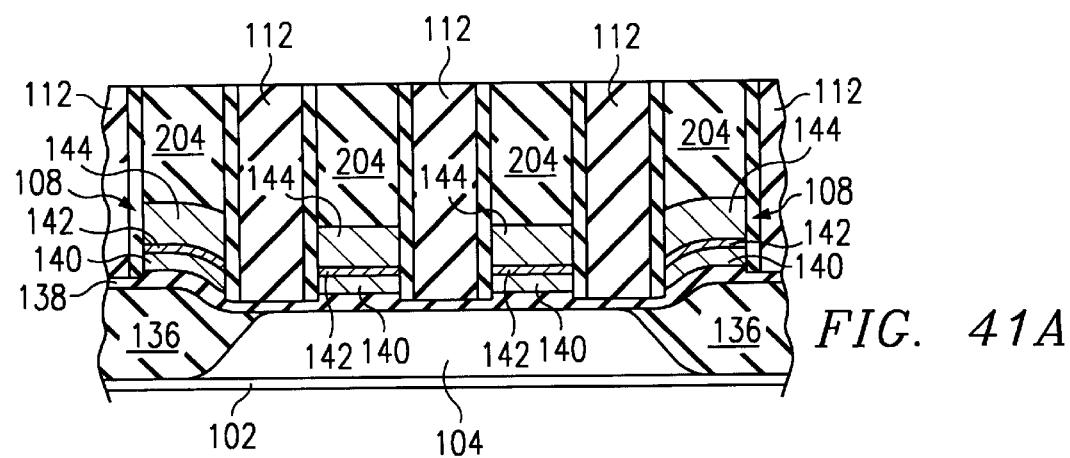
Figure 43A:
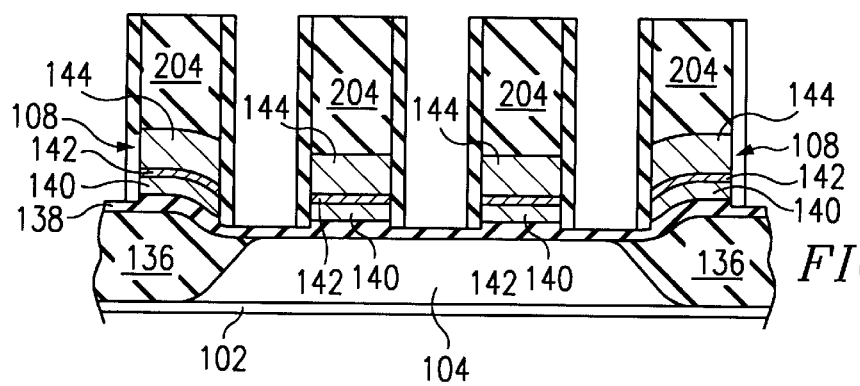
Figure 43B:
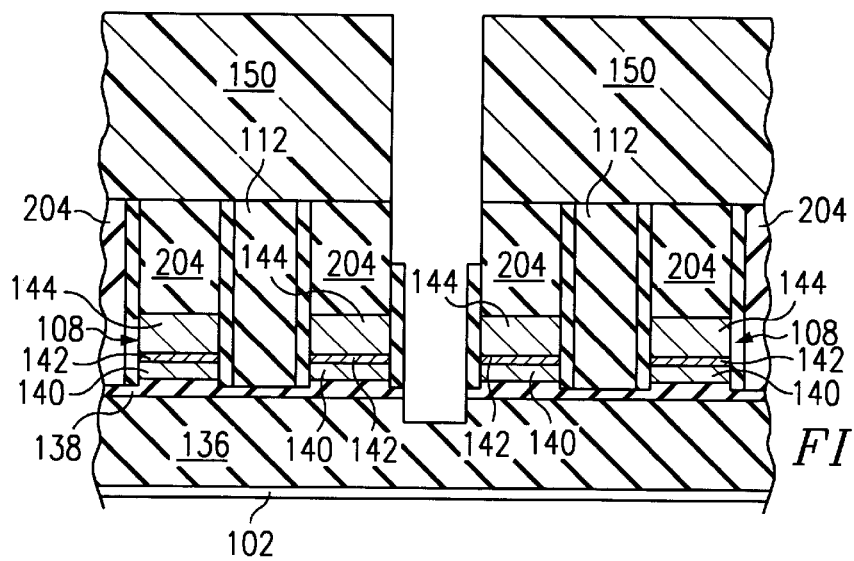
Figure 43C:
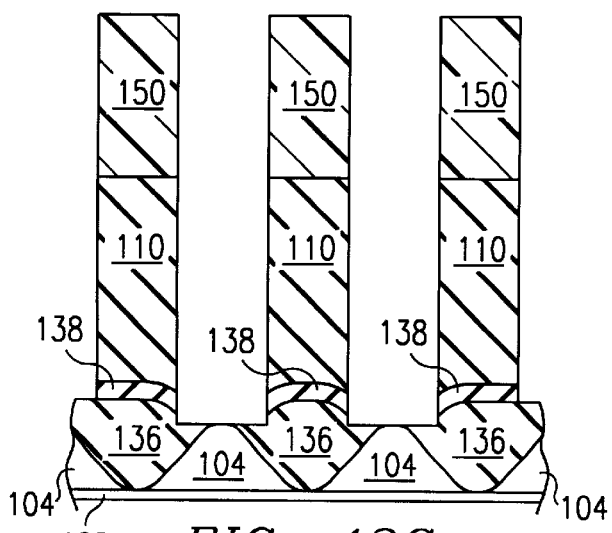
Figure 43D:
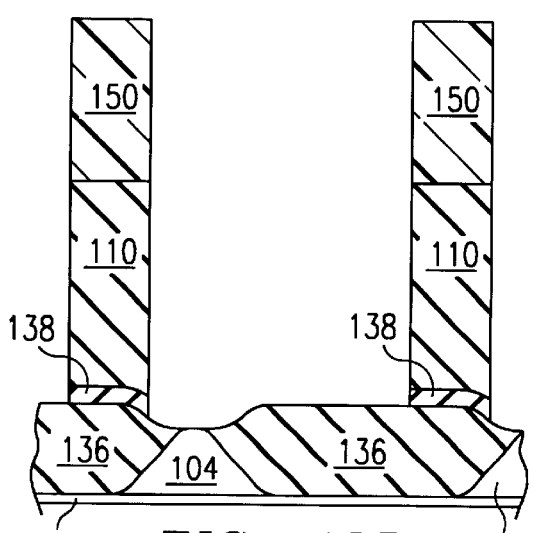
Figure 45A:
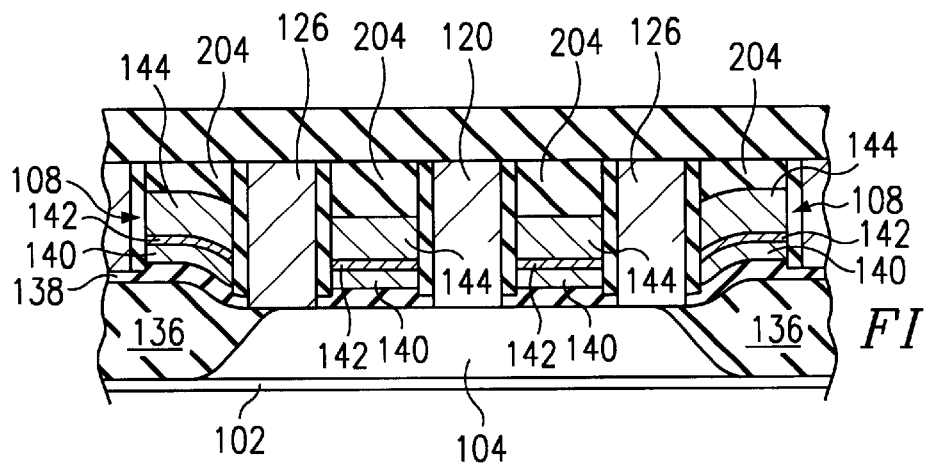
FIGS. 45A and 46A depict yet further method steps in the second method according the invention taken along line A—A in FIG. 4.
Figure 46A:
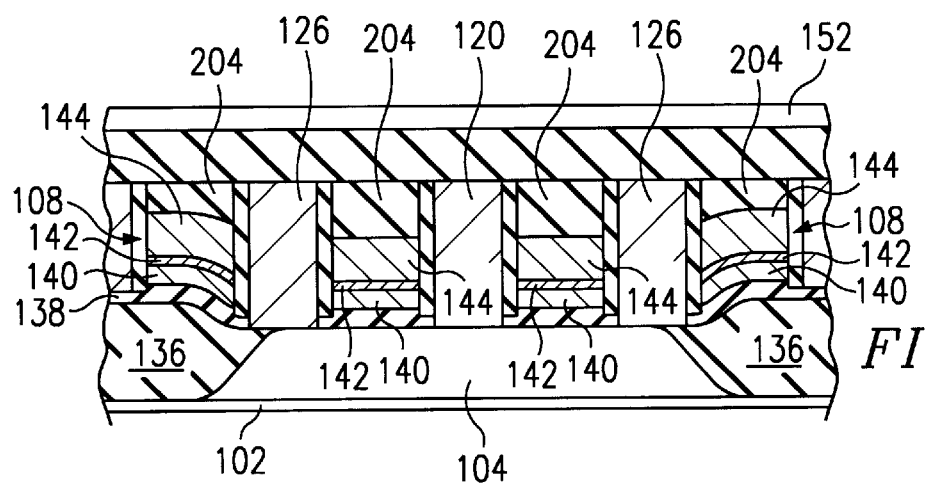
Figure 48A:
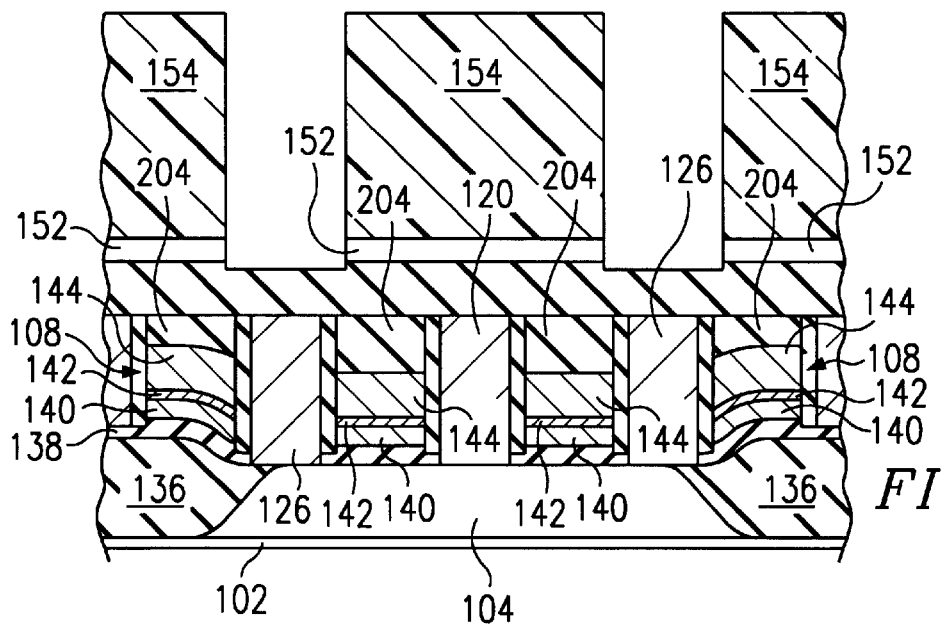
Figure 49A:
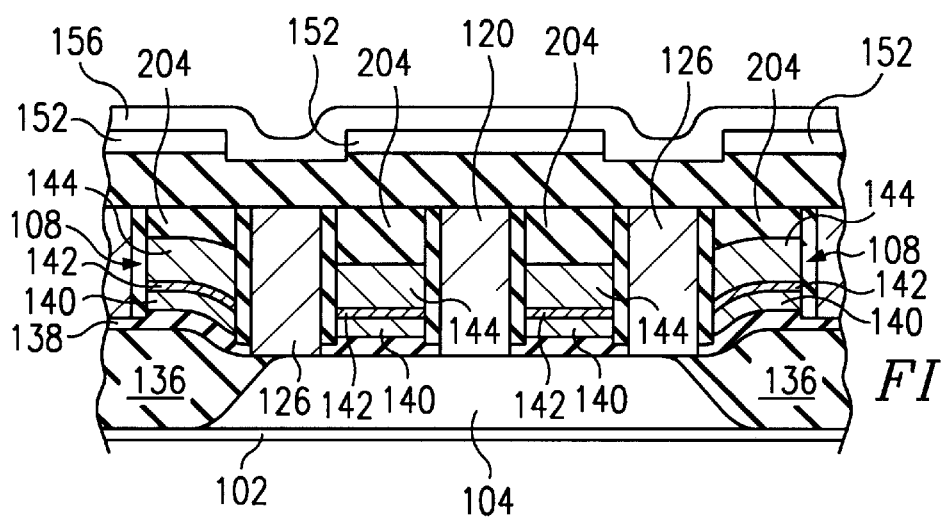
Figure 50A:
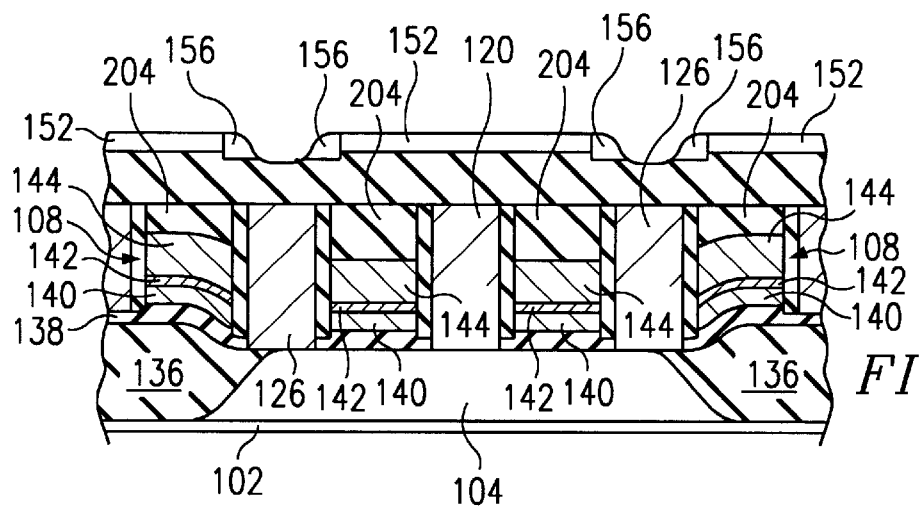
Figure 51A:
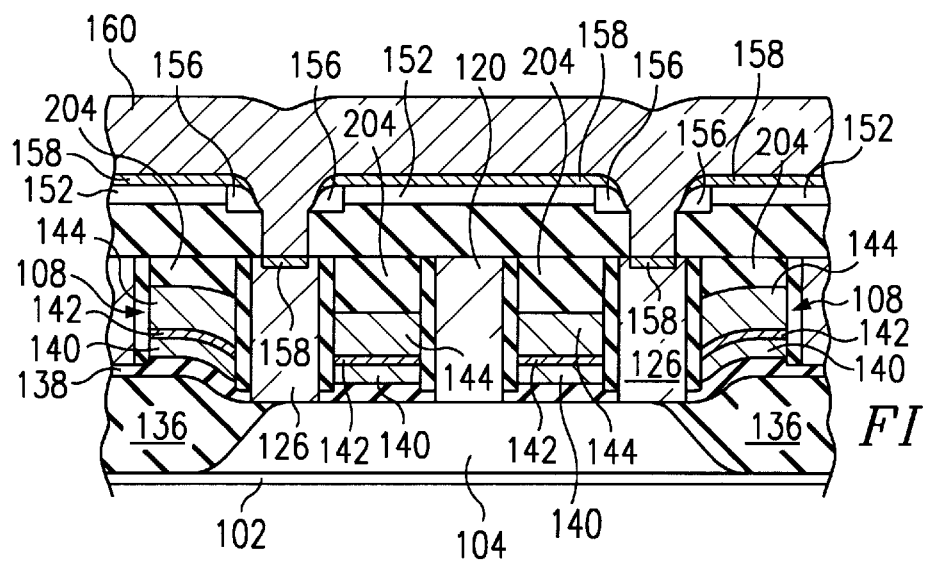
Figure 52A:
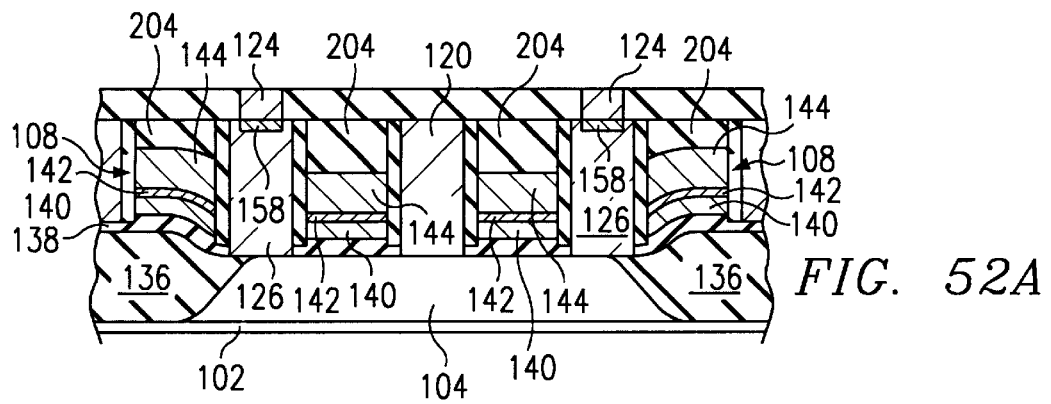
FIGS. 52A–52D depict still a further method step of the second method taken along lines A—A, B—B, C—C and D—D respectively of FIG. 4.
Figure 52B:
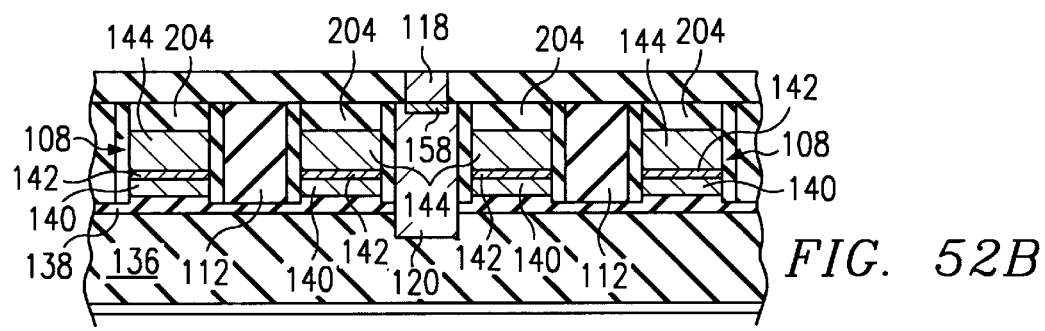
Figures 52C, 52D:
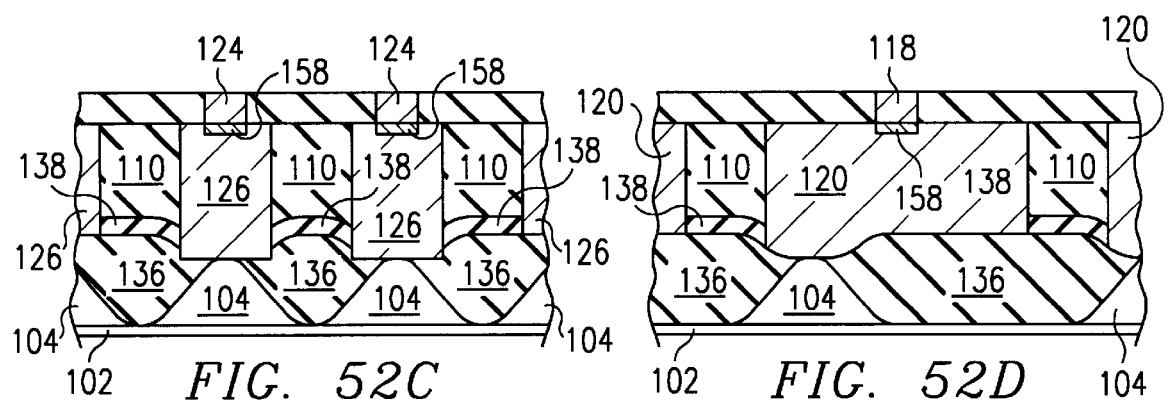
Figure 53A:
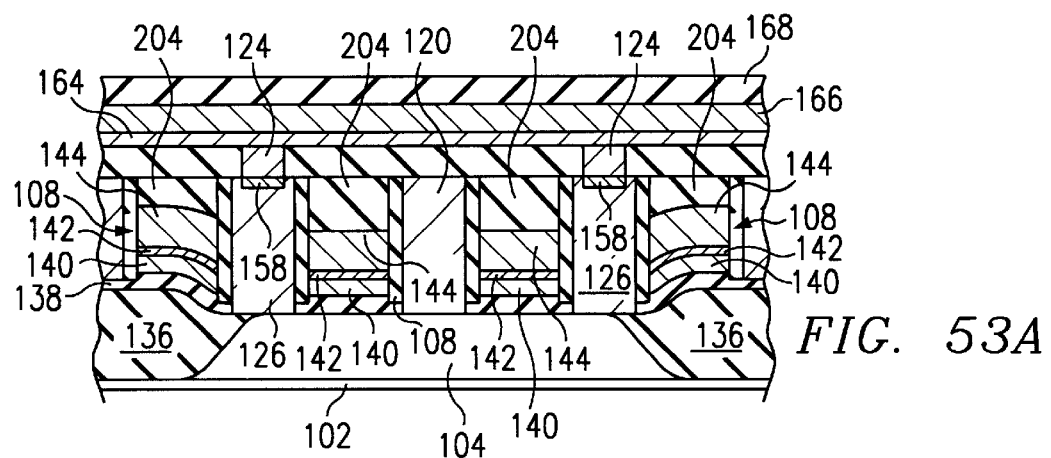
FIG. 53A depicts still a further method step of the second method taken along line A—A in FIG. 4.
Figure 54A:
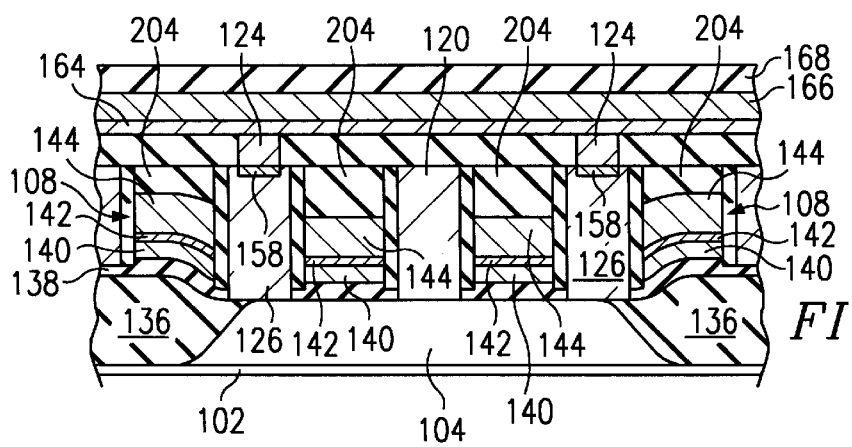
FIGS. 54A–54D depict still a further method step of the second method taken along lines A—A, B—B, C—C and D—D in FIG. 4 respectively.
Figure 54B:
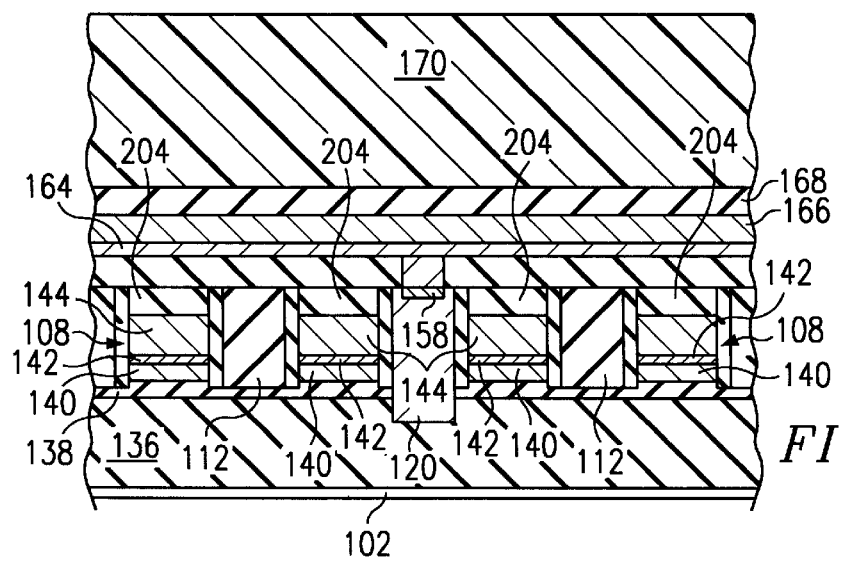
Figures 54C, 54D:
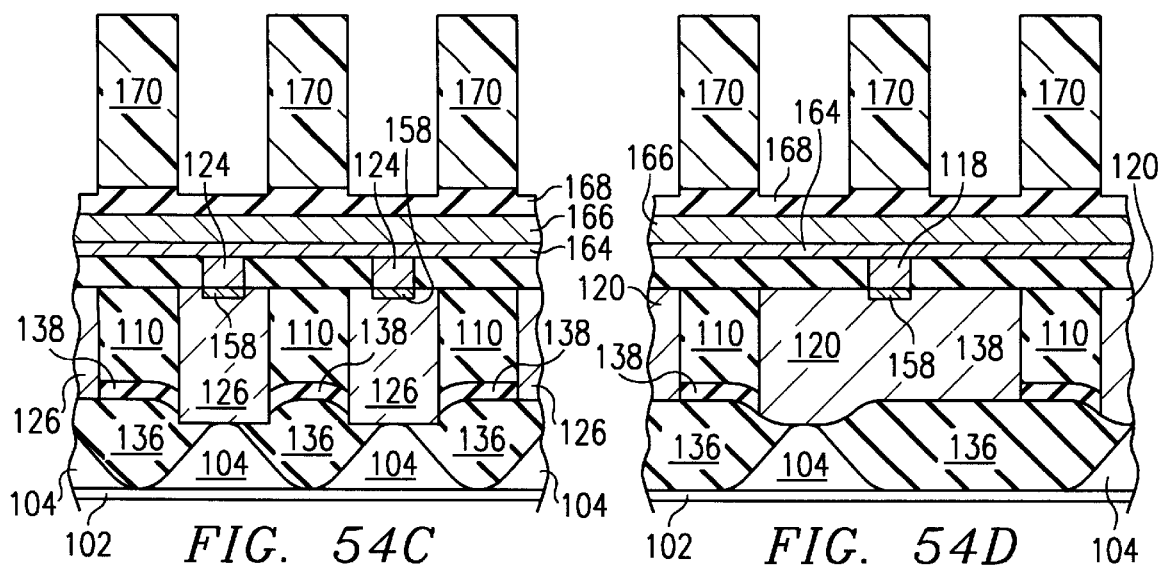
Figure 55A:
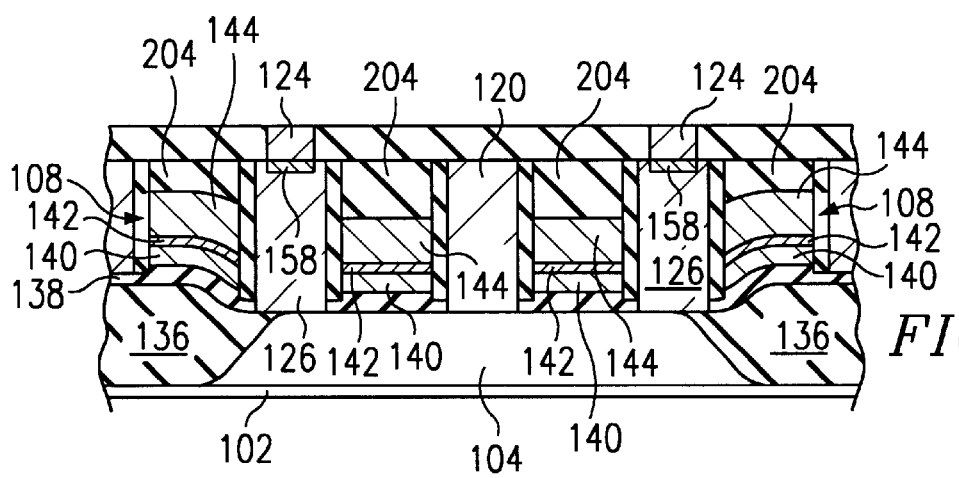
FIGS. 55A and 56A depict still further method steps of the second method taken along line A—A in FIG. 4.
Figure 56A:
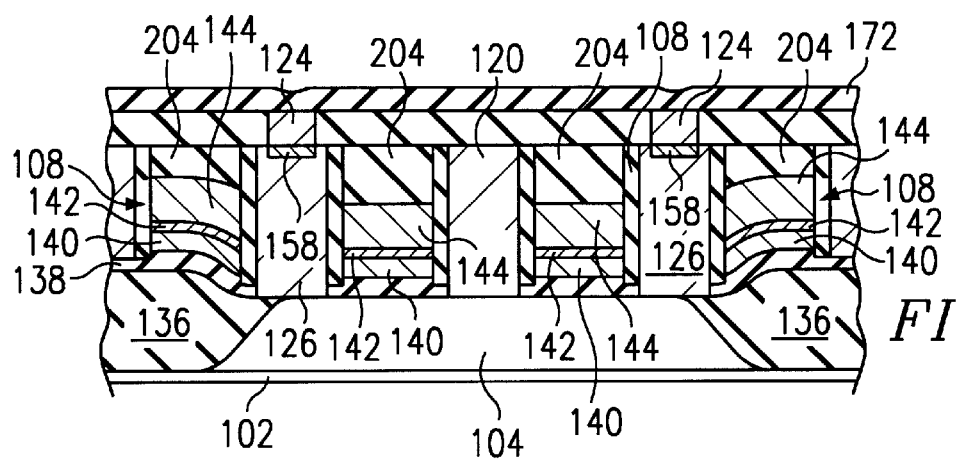
Figure 57A:
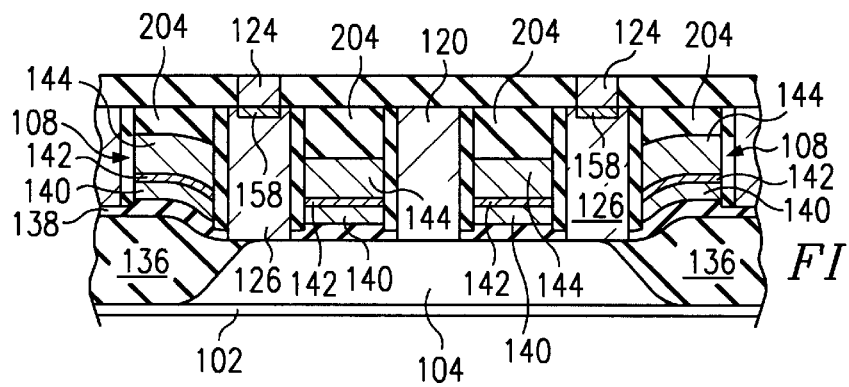
FIGS. 57A, 57C and 57D depict still a further step in the second method taken along lines A—A, C—C and D—D respectively of FIG. 4.
Figure 57C:
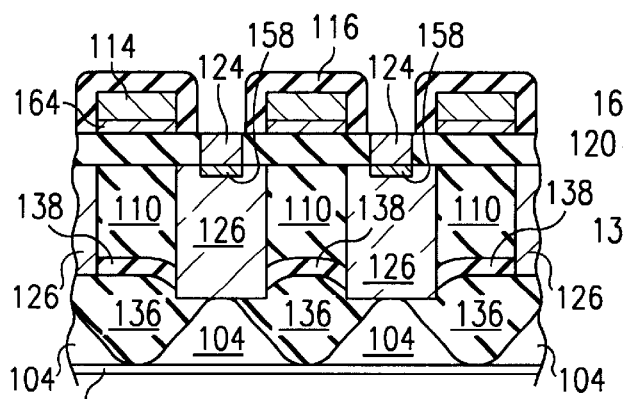
Figure 57D:
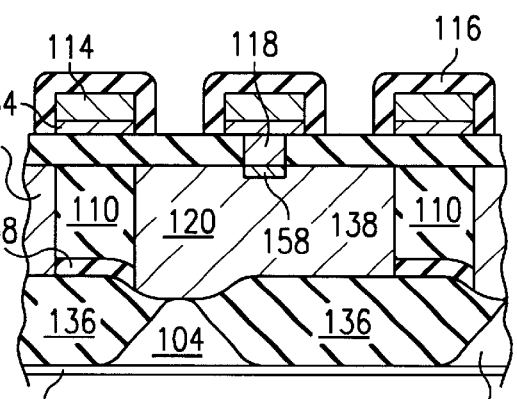
Figure 58A:
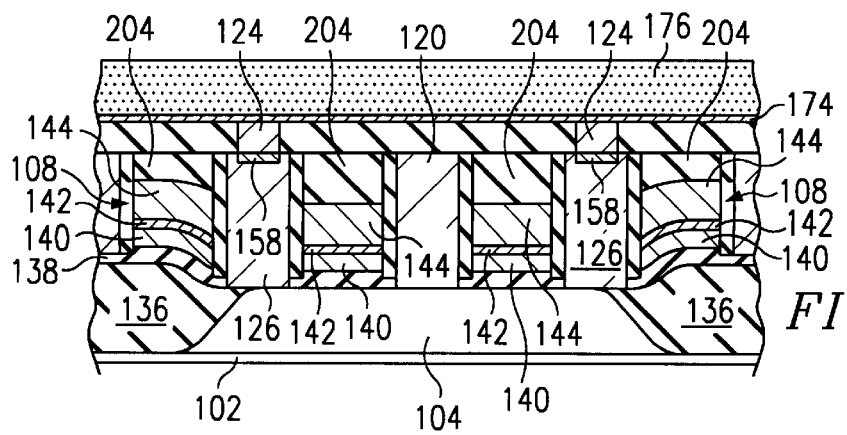
FIG. 58A depicts yet a further method step of the second method taken along line A—A in FIG. 4.
Figure 61:
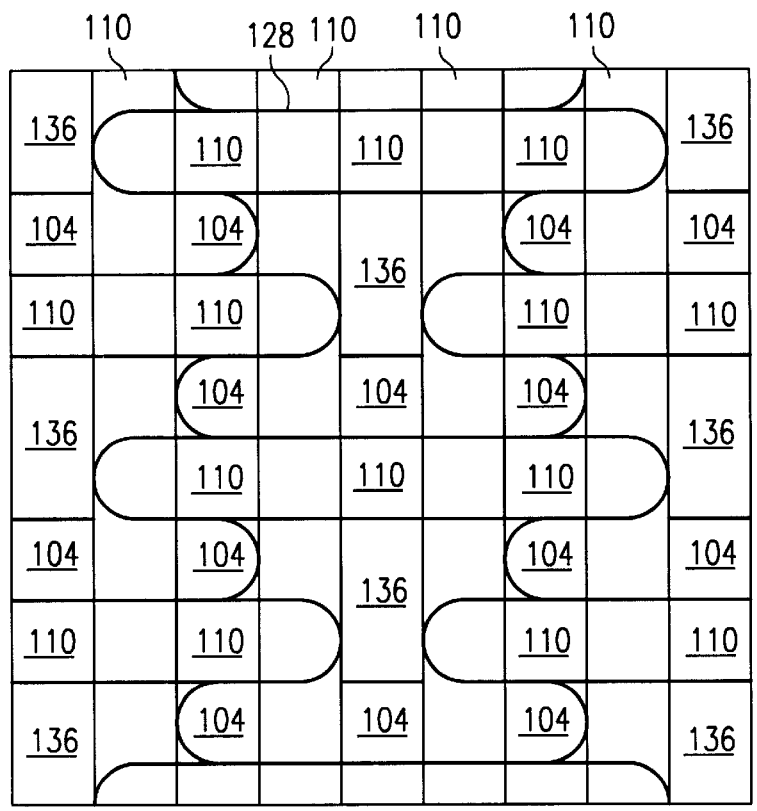
FIG. 61 depicts a top plan view of a DRAM device of the present invention during the manufacturing process according to the second manufacturing method.

Finally, a more specific example of the second method according to the present invention will be described with reference to FIGS. 35A–64, which are analogous to FIGS. 5A–34 discussed above. It will be appreciated that FIGS. 35A–39A are identical to FIGS. 5A–9A, except that the silicon dioxide layer 146 is replaced by an $Si_3N_4$ layer 204. In FIG. 40A, additional $Si_3N_4$ is deposited over the layer 204, following removal of the resist 148, and is then etched back. FIG. 41A is analogous to FIG. 11A, except that silicon dioxide is deposited instead of $Si_3N_4$. FIGS. 42A–42D are identical to FIGS. 12A–12D except that the silicon dioxide region 110 extends as shown in FIGS. 42C and 42D. FIGS. 43A–43D are identical to FIGS. 13A–13D, except that it is the silicon dioxide rather than the $Si_3N_4$ which is selectively etched. Comparison should be had to FIG. 61 which shows a top plan view corresponding to the cross-sections depicted in FIGS. 43A–43D.

Figure 62:
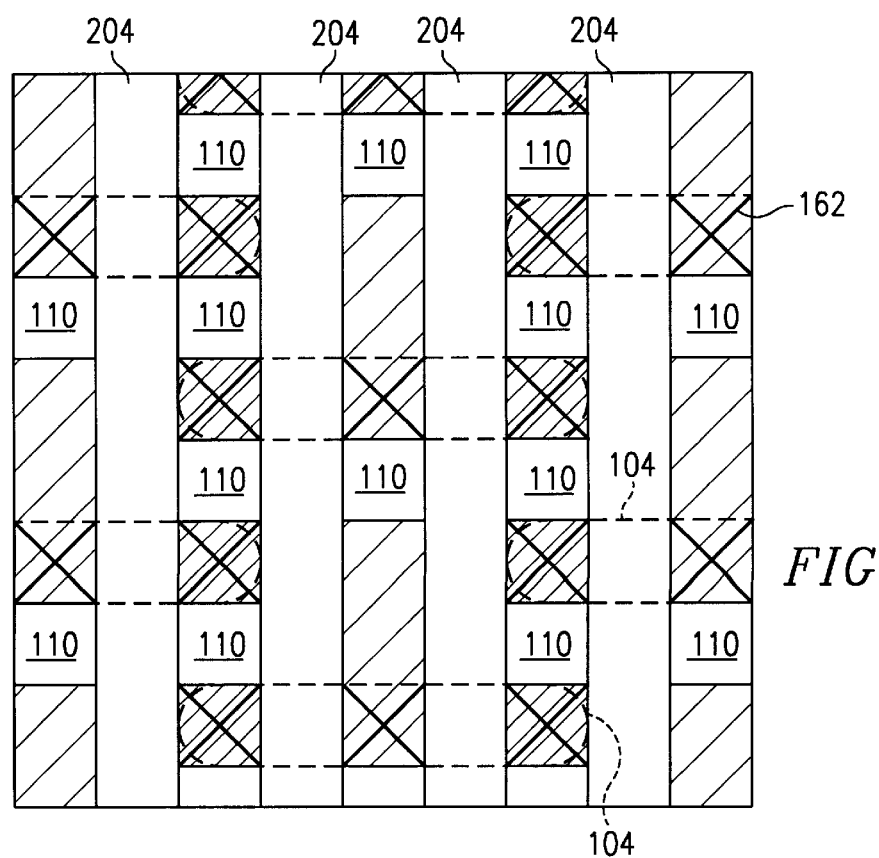
FIG. 62 is a view similar to FIG. 61 taken at a later stage in the manufacturing process.
Figure 63:
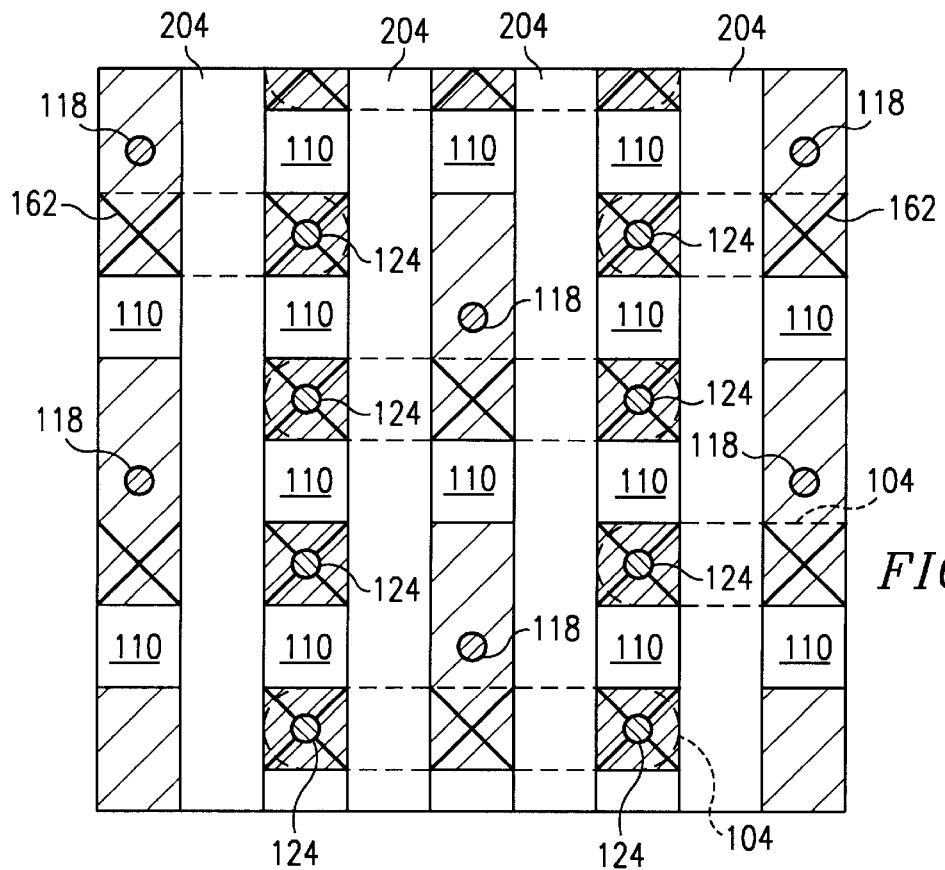
FIG. 63 is a view similar to FIGS. 61 and 62 taken at yet a later stage in the manufacturing process.
Figure 64:
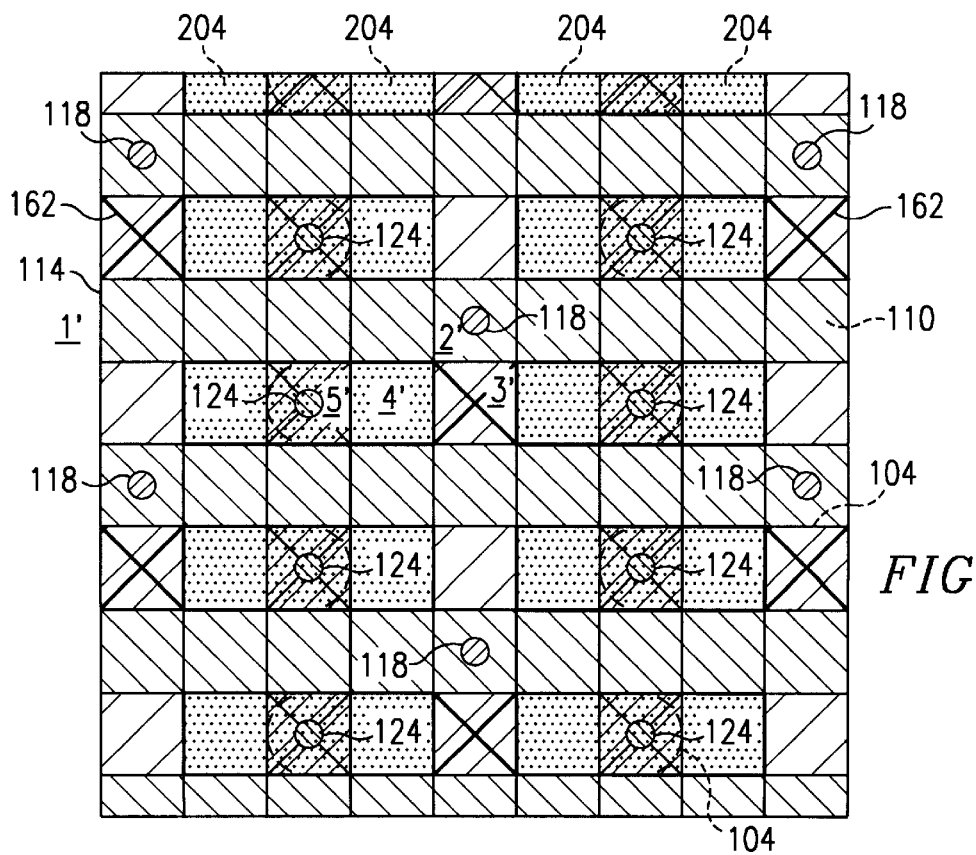
FIG. 64 is a top plan view of a DRAM cell array manufactured according to the second method of the present invention after formation of the bit line and periphery circuit contacts and formation of the storage nodes.

The method steps depicted in FIGS. 44A–44D are identical to those depicted in FIGS. 14A–14D, and a top plan view of the end result is depicted in FIG. 62. The "X" marks in FIG. 62 indicate the connecting points between the doped polysilicon 162 and the active regions 104. The remainder of the method steps depicted in FIGS. 45A–60D are substantially identical to those depicted in FIGS. 15A–30D. FIG. 63 is a top plan view corresponding to the cross sections depicted in FIGS. 52A–52D, while FIG. 64 is a top plan view corresponding to the cross-sections depicted in FIGS. 60A–60D. FIGS. 63 and 64 are analogous to FIGS. 33 and 34 respectively of the first method discussed above.

With reference to FIG. 64, the charge flows from the bit line 114, indicated at reference numeral 1', to the doped polysilicon layer through the storage node contact 126 and bit line contact 120 respectively, as shown at location 2', and then to the active region 104, as shown at location 3I, for the connection of the bit line 114 thereto. The path is subsequently through the transfer gate, at location 4', and then to the storage node 122 through the doped polysilicon layer as indicated at location 5'.

In view of the foregoing, it will be appreciated that the present invention provides reduced manufacturing costs, inasmuch as the special mask permits simultaneous formation, using the doped polysilicon layer, of the desired contacts. Further, the prior art first contact 20 and pad 24 are unified, such that the depth for the contact in the periphery circuit becomes sufficiently shallow that good ohmic contacts can be formed. Yet further, shorting of the polysilicon plugs can be avoided by making the special pattern longer than the active region, and protrusion of inwardly-projecting portions into adjacent regions can be avoided by forming them with a reduced diameter.

Note again that the present invention is applicable to both LOCOS isolation and trench isolation.

Although the present invention has been described in detail, it should be understood that various changes, substitutions and alterations can be made hereto without departing from the spirit and scope of the invention as defined by the appended claims.

What is claimed is:

1. A method for manufacturing a dynamic random access memory (DRAM) device sad method comprising the steps of:

(a) providing a substrate of semiconductor material having a main outer surface;

(b) forming, of said semiconductor material, a plurality of active regions extending outwardly from said main outer surface of said substrate, each of said active regions having an outer surface and having a longer and a shorter dimension when viewed in plan;

(c) forming a plurality of isolation regions, of an insulating material, between said active regions;

(d) forming a plurality of substantially parallel word lines located outwardly from said active regions in a direction substantially parallel to said shorter dimension of said active regions and substantially perpendicular to said longer dimension of said active regions, two of said word lines being associated with each of said active regions and two of said word lines being positioned between adjacent active regions;

(e) depositing a first word line insulation material to surround both said word lines and portions of said DRAM device where periphery circuit gate wiring is to be formed;

(f) filling spaces between said word lines with a second word line insulation material which is selectively etchable with respect to said first word line insulation material;

(g) applying a special pattern mask over portions of said second insulation material where the periphery circuit wiring is to be formed;

(h) selectively etching said second word line insulation material to create a plurality of doped polysilicon receiving cavities;

(i) depositing doped polysilicon in said doped polysilicon receiving cavities to form:
  a plurality of unitary bit line contacts having outer surfaces and extending inwardly to corresponding ones of said active regions, one each for each of said active regions; and
  a plurality of unitary storage node contacts having outer surfaces and extending inwardly to corresponding ones of said active regions, two each for each of said active regions;

(j) simultaneously forming a plurality of inwardly-projecting bit line portions, one for each of said bit line contacts, and a plurality of inwardly-projecting storage node portions, one for each of said storage node contacts;

(k) forming a plurality of substantially parallel bit lines located outwardly from said word lines and being substantially perpendicular thereto, said bit lines being located between adjacent ones of said active regions when viewed in plan, said bit lines being electrically isolated from each other, each of said bit lines being electrically interconnected with corresponding ones of said inwardly-projecting bit line portions; and (l) forming a plurality of storage nodes extending outwardly of said bit lines, each of said storage nodes having a longer and a shorter dimension when viewed in plan, said longer dimension of said storage nodes being generally parallel to said longer dimension of said active regions and said shorter dimension of said storage nodes being generally parallel to said shorter dimension of said active regions, at least substantial portions of said storage nodes being located substantially directly outwardly of said active regions when viewed in plan and being located between said bit lines when viewed in plan, said storage nodes being electrically interconnected with corresponding ones of said inwardly-projecting storage node portions.

2. The method of claim 1, wherein step (e) comprises depositing said first word line insulation material as silicon dioxide and wherein step (f) comprises filling said spaces with said second word line insulation material as $Si_3N_4$.

3. The method of claim 1, wherein step (e) comprises depositing said first word line insulation material as $Si_3N_4$ and wherein step (f) comprises filling said spaces between said word lines with said second word line insulation material as silicon dioxide.

4. The method of claim 1, wherein:
step (j) comprises simultaneously forming said plurality of inwardly-projecting bit line portions and said plurality of inwardly-projecting storage node portions of metal;

step (k) comprises forming said plurality of substantially parallel bit lines of metal;

step (g) comprises applying said special pattern mask in regions between said bit line contacts, in a direction substantially parallel to said long dimension of said active regions and substantially perpendicular to said short dimension of said active regions, so that no doped polysilicon receiving cavities are formed beneath said special pattern mask, whereby a polysilicon-free region is located between said bit line contacts, substantially inwardly of said bit lines, in a direction substantially parallel to said long dimension of said active regions and substantially perpendicular to said short dimension of said active regions, said special pattern mask, and thus, said polysilicon-free region, having a length greater than said longer dimension of said active regions.

5. The method of claim 4, wherein:
step (a) comprises providing said substrate of semiconductor material as a substrate of silicon;

step (b) comprising forming said plurality of active regions from silicon; and step (d) comprises forming said word lines with outer metal portions and inner portions of doped polysilicon.

6. The method of claim 1, wherein step (j) comprises forming said inward-projecting storage node portions with a diameter which is reduced in comparison to a dimension of said unitary storage node contacts, said reduced diameter of said inward-projecting portions of such storage nodes being selected to have a value which is less than a given resolution limit of equipment used in manufacturing said device.

7. The method of claim 1, wherein step (k) comprises forming said plurality of bit lines of metal in a manner such that they are adapted to serve as inner portions of periphery circuit contacts.

* * * * *